US011742287B2

(12) United States Patent
Do

(10) Patent No.: US 11,742,287 B2
(45) Date of Patent: Aug. 29, 2023

(54) STACKED INTEGRATED CIRCUIT DEVICES INCLUDING A ROUTING WIRE

(71) Applicant: Samsung Electronics Co., Ltd., Suwon-si (KR)

(72) Inventor: Jung Ho Do, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 98 days.

(21) Appl. No.: 17/518,627

(22) Filed: Nov. 4, 2021

(65) Prior Publication Data
US 2022/0059449 A1 Feb. 24, 2022

Related U.S. Application Data

(63) Continuation of application No. 16/947,693, filed on Aug. 13, 2020, now Pat. No. 11,195,794.

(60) Provisional application No. 62/970,283, filed on Feb. 5, 2020.

(51) Int. Cl.
*H01L 23/528* (2006.01)
*H01L 27/092* (2006.01)
*H01L 29/786* (2006.01)
*H01L 29/423* (2006.01)
*H01L 29/06* (2006.01)

(52) U.S. Cl.
CPC ........ *H01L 23/528* (2013.01); *H01L 27/0922* (2013.01); *H01L 29/0673* (2013.01); *H01L 29/42392* (2013.01); *H01L 29/78618* (2013.01); *H01L 29/78696* (2013.01)

(58) Field of Classification Search
CPC ............... H01L 23/528; H01L 27/0922; H01L 29/0673; H01L 29/42392; H01L 29/78618; H01L 29/78696; H01L 23/5286; H01L 27/0924; H01L 21/8221; H01L 21/823871; H01L 27/092; H01L 27/0688; H01L 27/0207
USPC ......................................................... 257/351
See application file for complete search history.

(56) References Cited

U.S. PATENT DOCUMENTS 7,307,020 B2   12/2007   Leedy
7,479,694 B2   1/2009    Leedy
9,685,436 B2   6/2017    Morrow et al.
(Continued)

FOREIGN PATENT DOCUMENTS

JP   WO2018179026   4/2019

*Primary Examiner* — Tong-Ho Kim
(74) *Attorney, Agent, or Firm* — Myers Bigel, P.A.

(57) ABSTRACT

Integrated circuit devices including standard cells are provided. The integrated devices may include a lower transistor region and an upper transistor region. The lower transistor region may include a lower active region, lower source/drain regions, and lower gate structures arranged alternately with the lower source/drain regions. The upper transistor region may include an upper active region, upper source/drain regions, and upper gate structures arranged alternately with the upper source/drain regions. The upper gate structures may include a first upper gate structure. The integrated devices may also include an input wire, an input via electrically connecting the input wire to the first upper gate structure, and a routing wire electrically connecting a pair of the lower source/drain regions or a pair of the upper source/drain regions. An upper surface of the routing wire may be closer to the substrate than an upper surface of the input wire.

20 Claims, 48 Drawing Sheets

(56) References Cited

U.S. PATENT DOCUMENTS

| | | |
|---|---|---|
| 10,049,946 B2 | 8/2018 | Oxland |
| 10,192,819 B1 | 1/2019 | Chanemougame et al. |
| 10,381,346 B1 | 8/2019 | Zhang et al. |
| 10,410,925 B2 | 9/2019 | Sills et al. |
| 11,195,794 B2 * | 12/2021 | Do .................. H01L 21/823871 |
| 2016/0197069 A1 | 7/2016 | Morrow et al. |
| 2018/0374791 A1 | 12/2018 | Smith et al. |
| 2019/0304974 A1 | 10/2019 | Sharma et al. |
| 2019/0326279 A1 | 10/2019 | Zhang et al. |
| 2020/0020812 A1 | 1/2020 | Masuoka et al. |
| 2020/0328201 A1 * | 10/2020 | Li ...................... H01L 29/0673 |

* cited by examiner

STACKED INTEGRATED CIRCUIT DEVICES INCLUDING A ROUTING WIRE

CROSS-REFERENCE TO RELATED APPLICATION

This application is a continuation of U.S. patent application Ser. No. 16/947,693, filed Aug. 13, 2020, which claims priority to U.S. Provisional Application Ser. No. 62/970,283, entitled STACKED DEVICE CELL WITH INTERNAL ROUTING, filed in the USPTO on Feb. 5, 2020, the disclosure of which is hereby incorporated by reference herein in its entirety.

FIELD

The present disclosure generally relates to the field of electronics and, more particularly, to stacked integrated circuit devices.

BACKGROUND

Stacked integrated devices have been researched because of their high integration density. However, stacked integrated devices may have a smaller area for wires than non-stacked integrated devices, which may result in interference or an electrical short between wires.

SUMMARY

According to some embodiments of the present inventive concept, integrated devices may include a lower transistor region on a substrate and an upper transistor region on the lower transistor region. The lower transistor region may include a lower active region extending in a first horizontal direction, a plurality of lower source/drain regions contacting the lower active region, and a plurality of lower gate structures that may contact the lower active region and may be arranged alternately with the plurality of lower source/drain regions along the first horizontal direction. The upper transistor region may include an upper active region extending in the first horizontal direction, a plurality of upper source/drain regions contacting the upper active region, and a plurality of upper gate structures that may contact the upper active region and may be arranged alternately with the plurality of upper source/drain regions along the first horizontal direction. The plurality of upper gate structures may include a first upper gate structure. The integrated devices may also include an input wire on the first upper gate structure, an input via that may be between the input wire and the first upper gate structure and may electrically connect the input wire to the first upper gate structure, and a routing wire that may extend in the first horizontal direction and may electrically connect a pair of the plurality of lower source/drain regions or a pair of the plurality of upper source/drain regions. The routing wire may include a lower surface facing the substrate and an upper surface opposite to the lower surface, and the upper surface of the routing wire may be closer to the substrate than an upper surface of the input wire.

According to some embodiments of the present inventive concept, integrated devices may include a lower transistor region on a substrate and an upper transistor region on the lower transistor region. The lower transistor region may include a lower active region extending in a first horizontal direction and a plurality of lower source/drain regions that may contact the lower active region and may be spaced apart from each other in the first horizontal direction. The plurality of lower source/drain regions may include a first lower source/drain region and a second lower source/drain region, and the first lower source/drain region may include a lower surface that may face the substrate and may be at a first level from the substrate and an upper surface that may be opposite to the lower surface of the first lower source/drain region and may be at a second level from the substrate. The upper transistor region may include an upper active region extending in the first horizontal direction and a plurality of upper source/drain regions that may contact the upper active region and may be spaced apart from each other in the first horizontal direction. The plurality of upper source/drain regions may include a first upper source/drain region and a second upper source/drain region, and the first upper source/drain region may include a lower surface that may face the substrate and may be at a third level from the substrate and an upper surface that may be opposite to the lower surface of the first upper source/drain region and may be at a fourth level from the substrate. The integrated devices may also include a routing wire that may extend in the first horizontal direction and may electrically connect the first and second lower source/drain regions or the first and second upper source/drain regions. The routing wire may be between an upper surface of the substrate and the first level, between the first level and the second level, between the second level and the third level, or between the third level and the fourth level.

According to some embodiments of the present inventive concept, integrated devices may include a lower transistor region on a substrate and an upper transistor region on the lower transistor region. The lower transistor region may include a lower active region extending in a first horizontal direction and a first lower source/drain region, a second lower source/drain region, and a third lower source/drain region. The first, second, and third lower source/drain regions may contact the lower active region and may be spaced apart from each other in the first horizontal direction. The upper transistor region may include an upper active region extending in the first horizontal direction and a first upper source/drain region, a second upper source/drain region, and a third upper source/drain region. The first, second, and third upper source/drain regions may contact the upper active region and may be spaced apart from each other in the first horizontal direction. The integrated devices may also include a routing wire that may extends in the first horizontal direction and may electrically connect the first lower source/drain region to the third lower source/drain region or may electrically connect the first upper source/drain region to the third upper source/drain region. The routing wire may include a lower surface facing the substrate and an upper surface opposite to the lower surface, and the upper surface of the routing wire may be not farther from the substrate than an upper surface of the first upper source/drain region.

BRIEF DESCRIPTION OF THE DRAWINGS

FIG. 2 is divided into FIGS. 3A and 3B to simplify the drawings.

FIG. 21 is divided into FIGS. 22A and 22B to simplify the drawings.

DETAILED DESCRIPTION

A standard cell of an integrated circuit device may include multiple wires including, for example, an input wire electrically connected to an input node, an output wire electrically connected to an output node, and a routing wire electrically connecting elements that may be formed before the input and output wires are formed. The input and output wires may be formed after a gate structure of the standard cell is formed and may be formed of metal. The routing wire may be formed concurrently with the input and output wires and may be provided at a level equal to a level of the input and output wires. The routing wire of the standard cell may electrically connect elements of adjacent standard cells.

In some embodiments, the routing wire may be formed before the input and output wires are formed and/or may be provided to be closer to a substrate than the input and output wires. As the routing wire is provided at a level different from a level of the input and output wires, a width of the input and output wires and/or a space between the input and output wires may increase.

In some embodiments, a standard cell may be a stacked device including a lower transistor region and an upper transistor region stacked on a substrate. Input and output wires of the stacked devices may be formed on the upper transistor region, and a routing wire may be formed in the lower transistor region and/or the upper transistor region. Accordingly, the routing wire may be provided at a level different from a level of the input and output wires, and thus a width of the input and output wires and/or a space between the input and output wires may increase.

A single integrated circuit device may include multiple standard cells therein. According to some embodiments of the present inventive concept, a standard cell may be, for example, an inverter, a 2-input NAND gate, a 3-input NAND gate, a 2-input NOR gate, a 3-input NOR gate, an AOI, an Or-And inverter (OAI), an XNOR gate, an XOR gate, a multiplexer (MUX), a latch, or a D-flip-flop. Although an AOI and an inverter are described herein as example embodiments, the present inventive concept is not limited thereto. The present inventive concept may be applicable to any standard cell including a routing wire therein.

Figure 1:
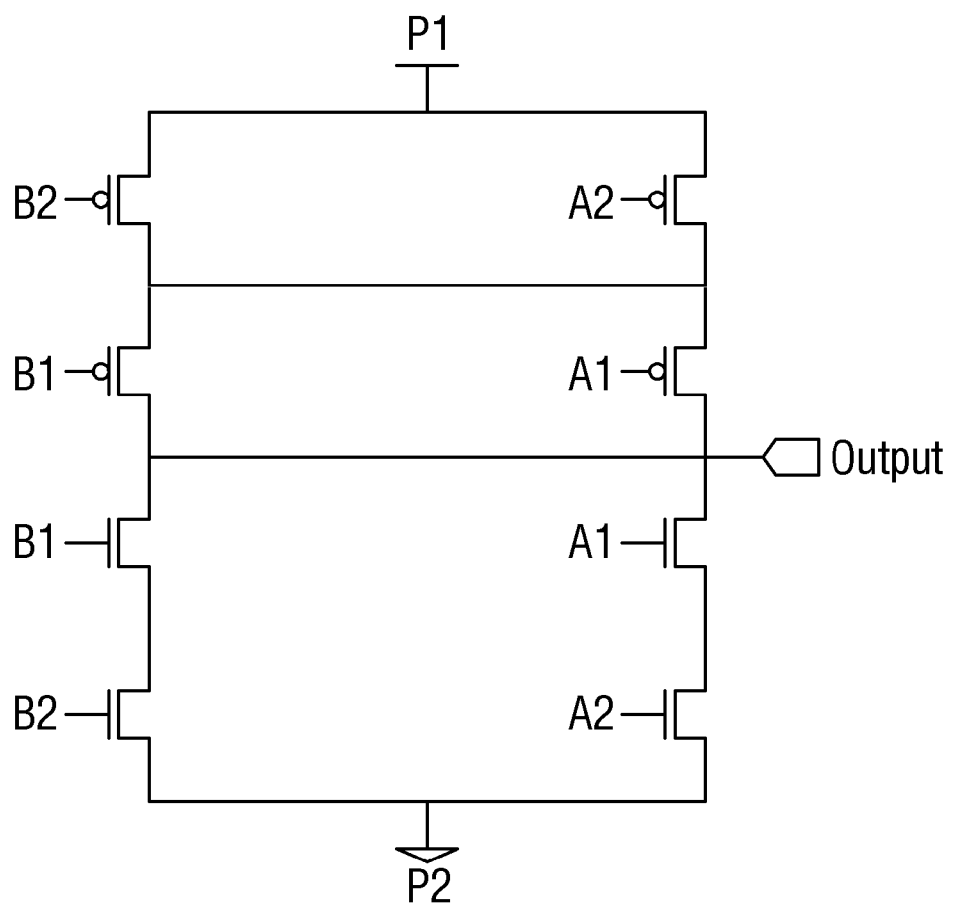
FIG. 1 is a circuit diagram of an And-Or inverter (AOI) according to some embodiments of the present inventive concept.
Figure 2:
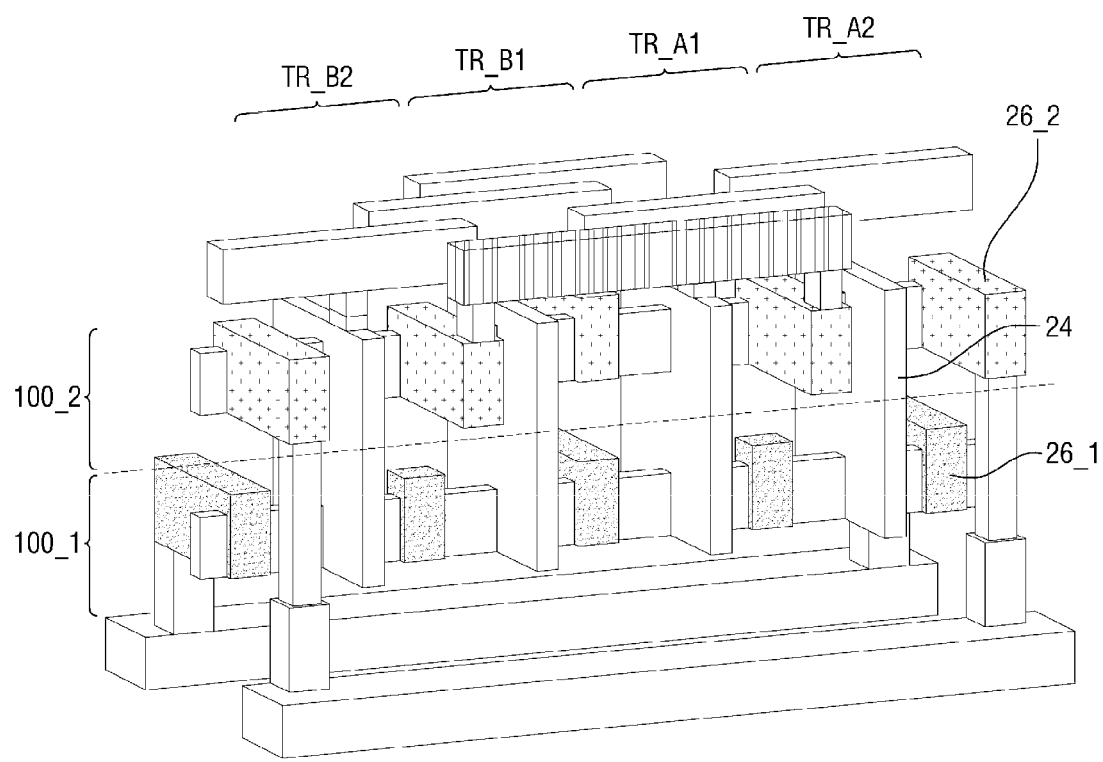
FIG. 2 is a perspective view of the AOI of FIG. 1 according to some embodiments of the present inventive concept.
Figure 3A:
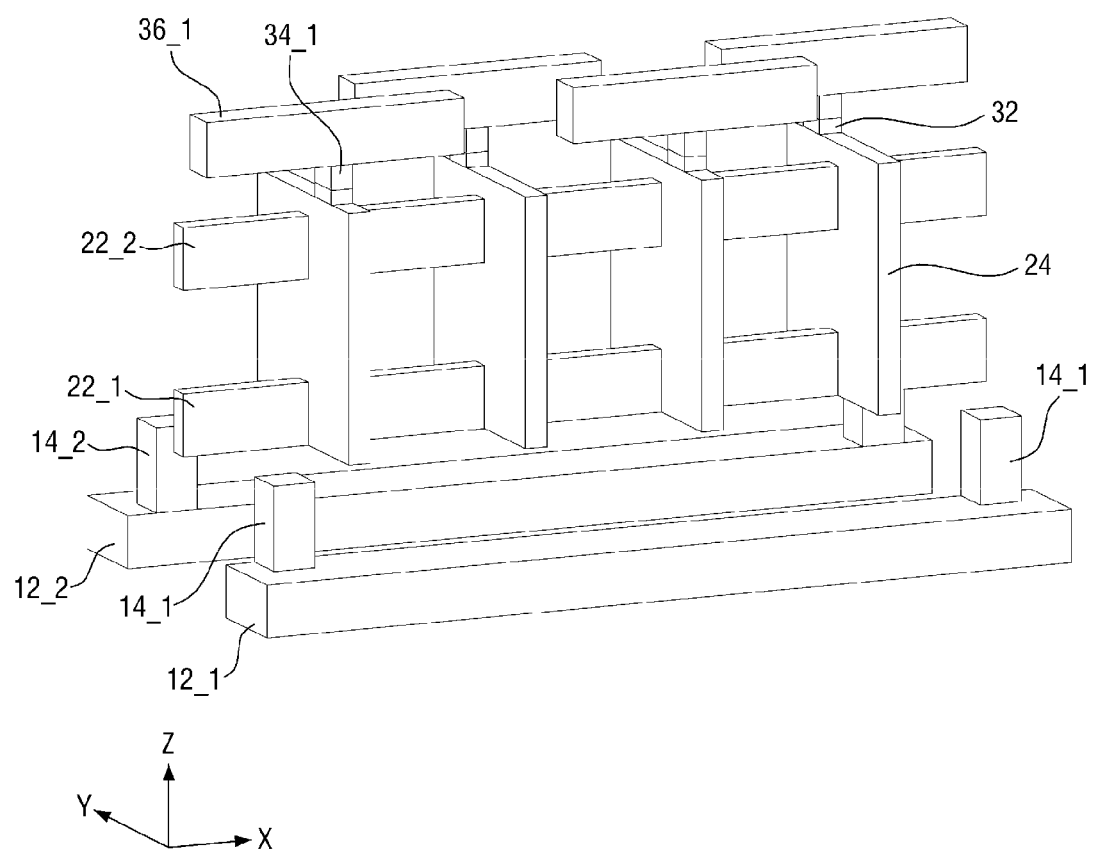
FIGS. 3A and 3B are perspective views of the AOI of FIG. 2 showing a group of elements of FIG. 2.
Figure 3B:
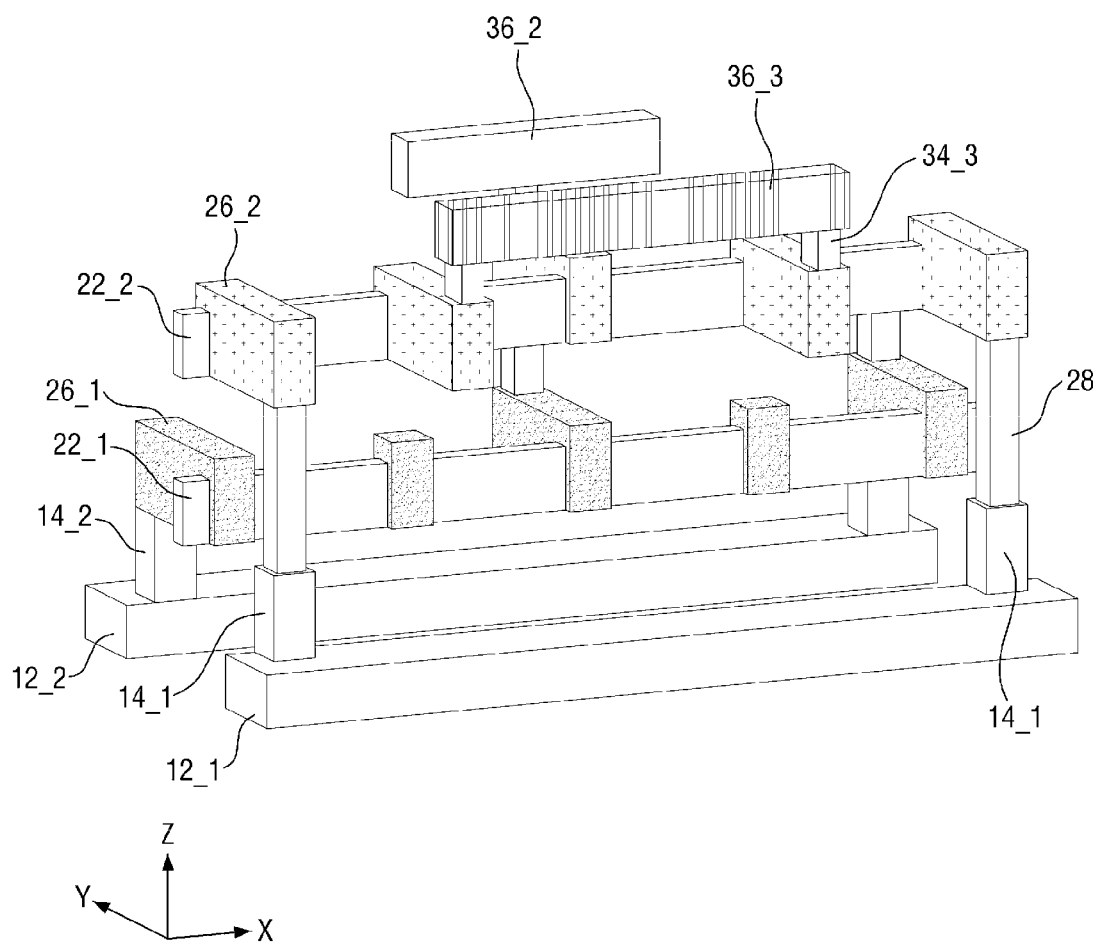

FIG. 1 is a circuit diagram of an AOI according to some embodiments of the present inventive concept. FIG. 2 is a perspective view of the AOI of FIG. 1 according to some embodiments of the present inventive concept, and each of FIGS. 3A and 3B is a perspective view of the AOI of FIG. 2. FIG. 2 is divided into FIGS. 3A and 3B to simplify the drawings, and each of FIGS. 3A and 3B shows some elements (but not all elements) of FIG. 2.

Referring to FIGS. 1, 2, 3A and 3B, the AOI may be a stacked device including a lower transistor region 100_1 and an upper transistor region 100_2. The lower transistor region 100_1 may include four N-type transistors that may be arranged along a first direction X and may be configured to receive four inputs (i.e., B2, B1, A1, and A2 in FIG. 1). The upper transistor region 100_2 may include four P-type transistors that may be arranged along the first direction X and may be configured to receive four inputs (i.e., B2, B1, A1, and A2 in FIG. 1). The AOI may be connected to a first power P1 and a second power P2 and may output a single output Output. Although not illustrated, various insulating layers may be provided between elements shown in FIGS. 2, 3A and 3B for electrical isolation of these elements.

The AOI may include a first transistor region TR_B2, a second transistor region TR_B1, a third transistor region TR_A1, and a fourth transistor region TR_A2 that may be arranged along the first direction X. The first transistor region TR_B2 may include an N-type transistor and a P-type transistor that are stacked in a third direction Z and may be configured to receive a first input B2. The second transistor region TR_B1 may include an N-type transistor and a P-type transistor that are stacked in the third direction Z and may be configured to receive a second input B1. The third transistor region TR_A1 may include an N-type transistor and a P-type transistor that are stacked in the third direction Z and may be configured to receive a third input A1. The fourth transistor region TR_A2 may include an N-type transistor and a P-type transistor that are stacked in the third direction Z and may be configured to receive a fourth input A2.

The AOI may include a first power line 12_1 and a second power line 12_2 that may extend in the first direction X and may be spaced apart from each other in a second direction Y. As used herein "an element A extends in a direction X" (or similar language) may mean that the element A extends longitudinally in the direction X. The first power line 12_1 may be connected to the first power P1 having a first voltage (e.g., a drain voltage), and the second power line 12_2 may be connected to the second power P2 having a second voltage (e.g., a source voltage). First power vias 14_1 may be provided on the first power line 12_1 and may electrically connect the first power line 12_1 to other elements (e.g., upper source/drain regions 26_2). Second power vias 14_2 may be provided on the second power line 12_2 and may electrically connect the second power line 12_2 to other elements (e.g., lower source/drain regions 26_1).

The lower transistor region 100_1 may include a lower active region 22_1 that may extend in the first direction X and lower source/drain regions 26_1 that may contact the lower active region 22_1. The lower source/drain regions 26_1 may be spaced apart from each other and may be arranged along the first direction X.

The upper transistor region 100_2 may include an upper active region 22_2 that may extend in the first direction X and upper source/drain regions 26_2 that may contact the upper active region 22_2. The upper source/drain regions 26_2 may be spaced apart from each other and may be arranged along the first direction X.

Gate structures 24 that may contact the lower active region 22_1 and the upper active region 22_2 may be provided. The gate structures 24 may be spaced apart from each other and may be arranged along the first direction X. Lower portions of the gate structures 24 may be arranged alternately with the lower source/drain regions 26_1, and upper portions of the gate structures 24 may be arranged alternately with the upper source/drain regions 26_2 as illustrated in FIG. 2. As used herein "a lower portion X of an element A" (or similar language) may mean that the lower portion X of the element A is closer to a substrate (e.g., a substrate 10 in FIG. 5A) than an upper portion of the element A.

Input wires 36_1 may be provided on the gate structures 24 and may be electrically connected to the gate structures 24, respectively. A gate contact 32 and an input via 34_1 may be provided between the gate structure 24 and the input wire 36_1 and may electrically connect the input wire 36_1 to the gate structure 24. In some embodiments, the gate contacts 32 may contact the gate structures 24, respectively, and the input vias 34_1 may contact the input wires 36_1, respectively, as illustrated in FIG. 3A. Each of the input wires 36_1 may extend in the first direction X.

An output wire 36_2 may be provided on the upper source/drain region 26_2 and may extend in the first direction X. A routing wire 36_3 may be provided on the upper source/drain regions 26_2 and may extend in the first direction X. The routing wire 36_3 may electrically connect two upper source/drain regions 26_2. Two routing vias 34_3 may be provided between the routing wire 36_3 and the two upper source/drain regions 26_2 to electrically connect the routing wire 36_3 to the two upper source/drain regions 26_2. Each of the input wires 36_1, the output wire 36_2, and the routing wire 36_3 may include a conductive material and may include metal, for example, cobalt (Co), tungsten (W), aluminum (Al), and/or copper (Cu).

Power contacts 28 may be provided on the first power line 12_1 and may electrically connect the upper source/drain regions 26_2 to the first power line 12_1.

Figure 4:
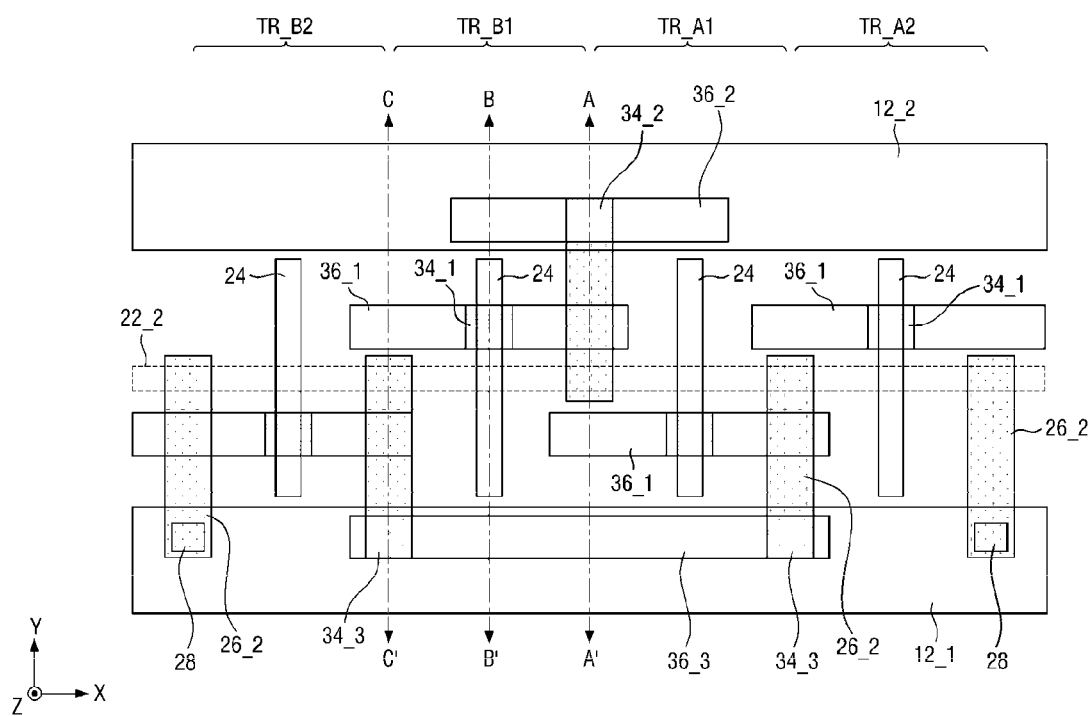
FIG. 4 is a layout of the AOI of FIG. 2 according to some embodiments of the present inventive concept.
Figure 5A:
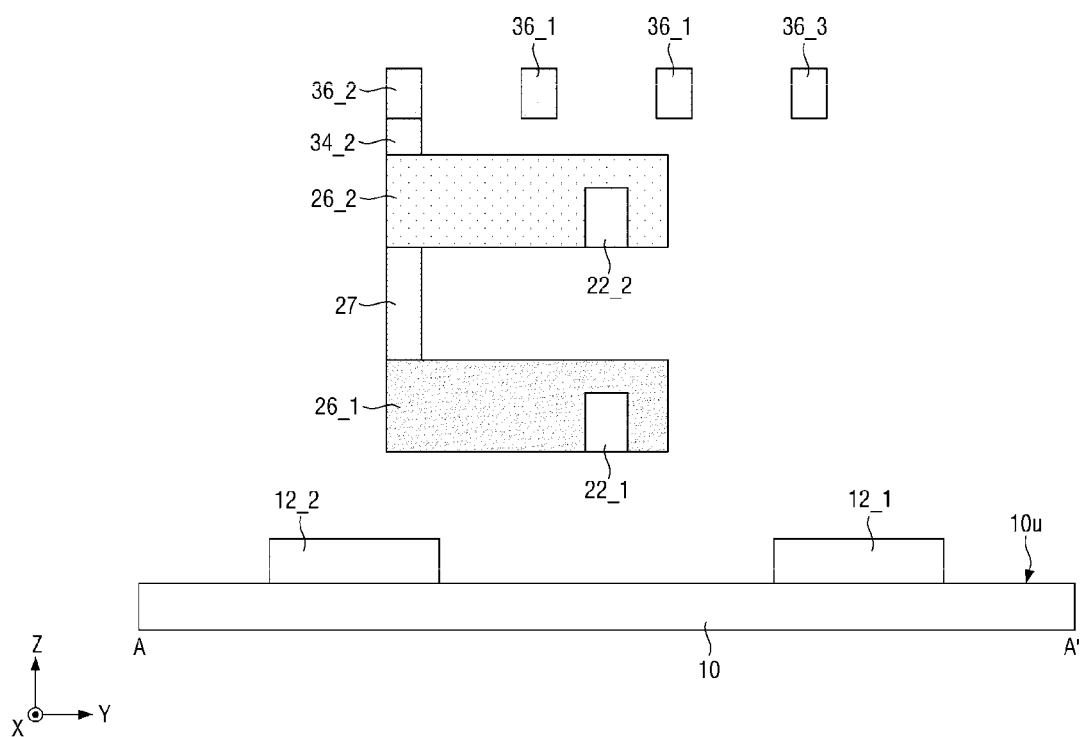
FIGS. 5A, 5B, and 5C are cross-sectional views taken along the lines A-A', B-B', and C-C' of FIG. 4, respectively, according to some embodiments of the present inventive concept.
Figure 5B:
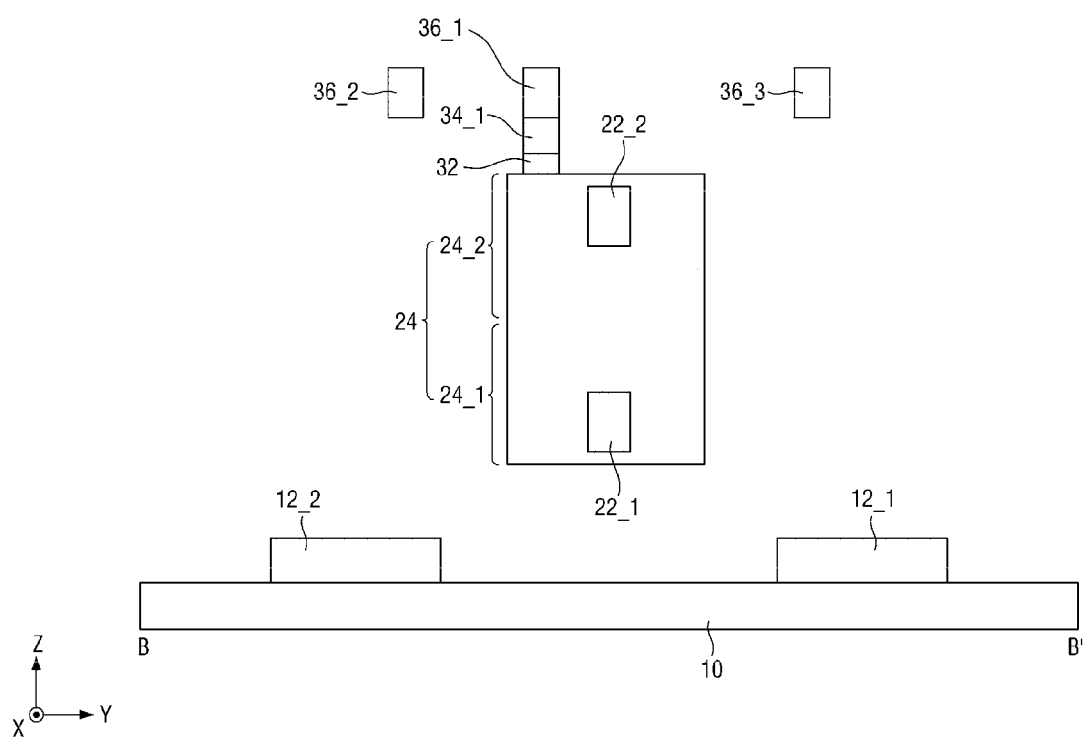
Figure 5C:
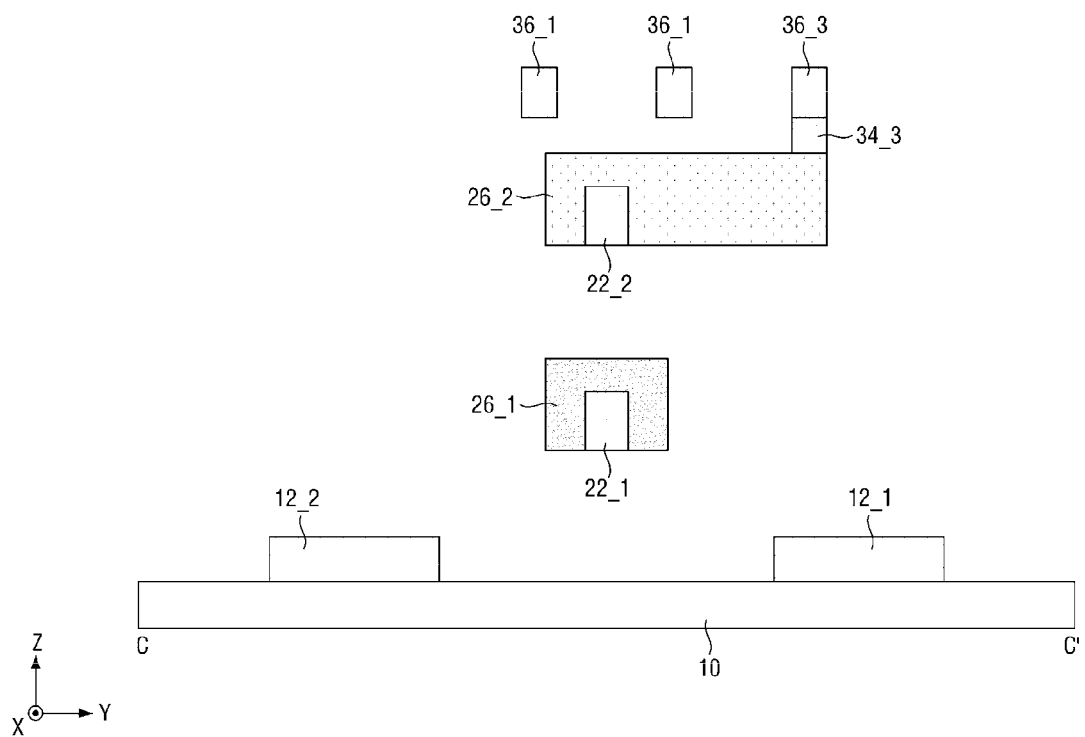

FIG. 4 is a layout of the AOI of FIG. 2 according to some embodiments of the present inventive concept. Some elements (e.g., lower source/drain regions 26_1) shown in FIG. 2 are not shown in FIG. 4 for simplicity of illustration. FIGS. 5A, 5B, and 5C are cross-sectional views taken along the lines A-A', B-B', and C-C' of FIG. 4, respectively, according to some embodiments of the present inventive concept.

Referring to FIG. 5A, the first power line 12_1 and the second power line 12_2 may be provided on a substrate 10. The substrate 10 may include an upper surface 10u that may be parallel to the first direction X and the second direction Y. The first direction X may be a first horizontal direction, and the second direction Y may be a second horizontal direction. The first direction X may traverse the second direction Y. In some embodiments, the first direction X may be perpendicular to the second direction Y. The third direction Z may be perpendicular to the upper surface 10u of the substrate 10 and may be a vertical direction.

A source/drain contact (e.g. via) 27 may be provided between the upper source/drain region 26_2 and the lower source/drain region 26_1 to electrically connect the upper source/drain region 26_2 to the lower source/drain region 26_1. In some embodiments, the input wires 36_1, the output wire 36_2, and the routing wire 36_3 may be on the same level from the substrate 10, and lower surfaces of the input wires 36_1, the output wire 36_2, and the routing wire 36_3 may be coplanar with each other as illustrated in FIG. 5A. As used herein "a lower surface of an element A" (or similar language) may refer to a surface of the element A facing a substrate (e.g., a substrate 10 in FIG. 5A).

Referring to FIG. 5B, the gate structure 24 may include a lower gate structure 24_1 contacting the lower active region 22_1 and an upper gate structure 24_2 contacting the upper active region 22_2. The gate structure 24 may include a gate insulator and a gate electrode, and the gate insulator may extend between the gate electrode and the lower and upper active regions 22_1 and 22_2 to electrically isolate the gate electrode from the lower and upper active regions 22_1 and 22_2. The gate insulator may completely enclose the lower and upper active regions 22_1 and 22_2.

Referring to FIG. 5C, the routing via 34_3 may contact the upper source/drain region 26_2 and the routing wire 36_3 and may electrically connect the routing wire 36_3 to the upper source/drain region 26_2.

Figure 6:
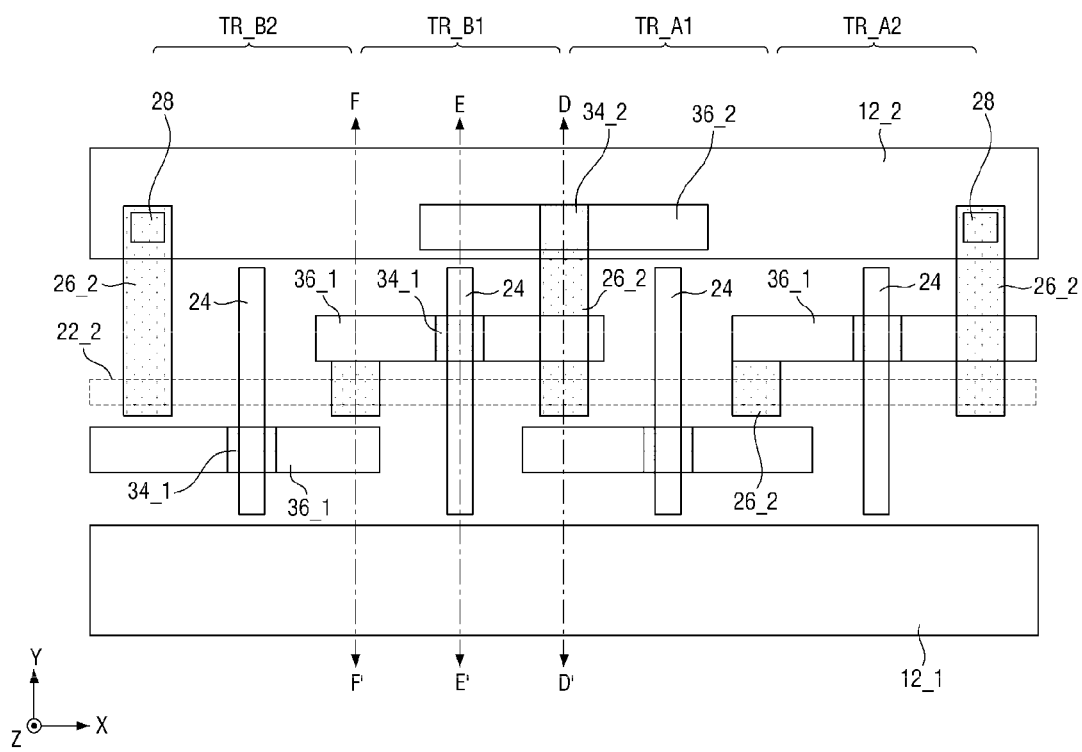
FIGS. 6 and 7 are layouts of the AOI of FIG. 1 according to some embodiments of the present inventive concept.
Figure 7:
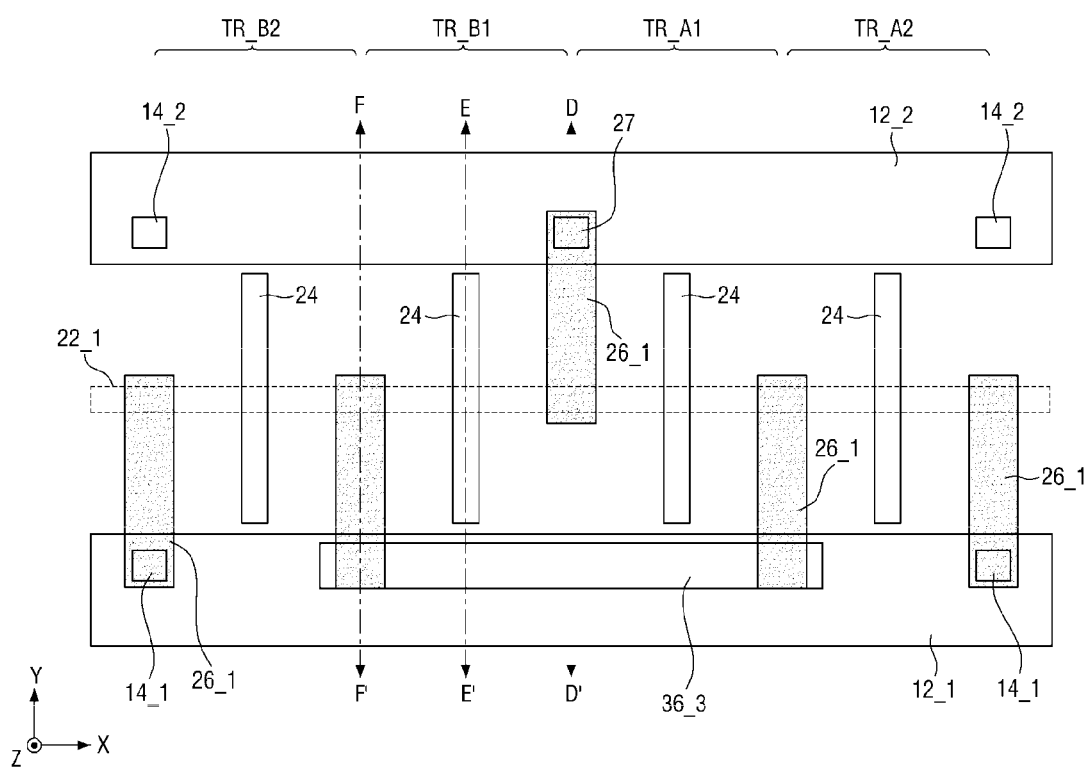
Figure 8:
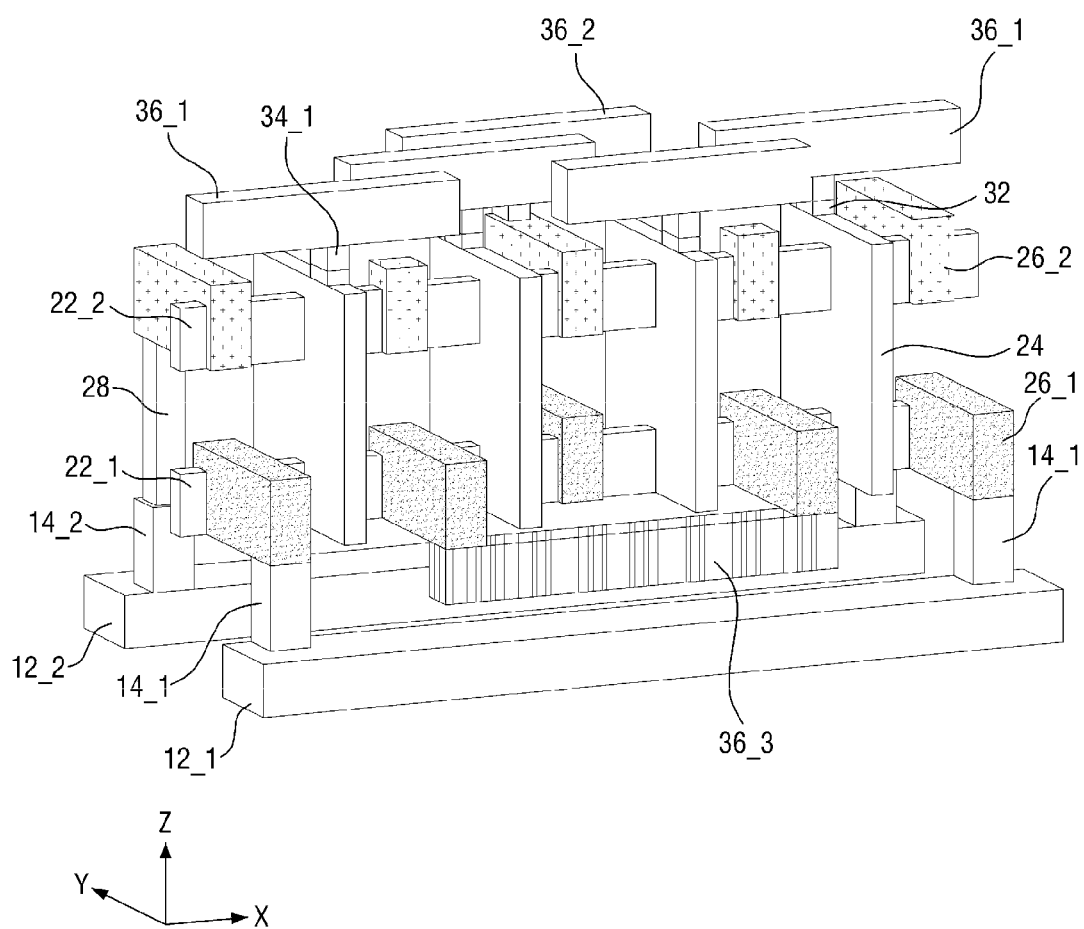
FIG. 8 is a perspective view of the AOI of FIGS. 6 and 7 according to some embodiments of the present inventive concept.
Figure 9A:
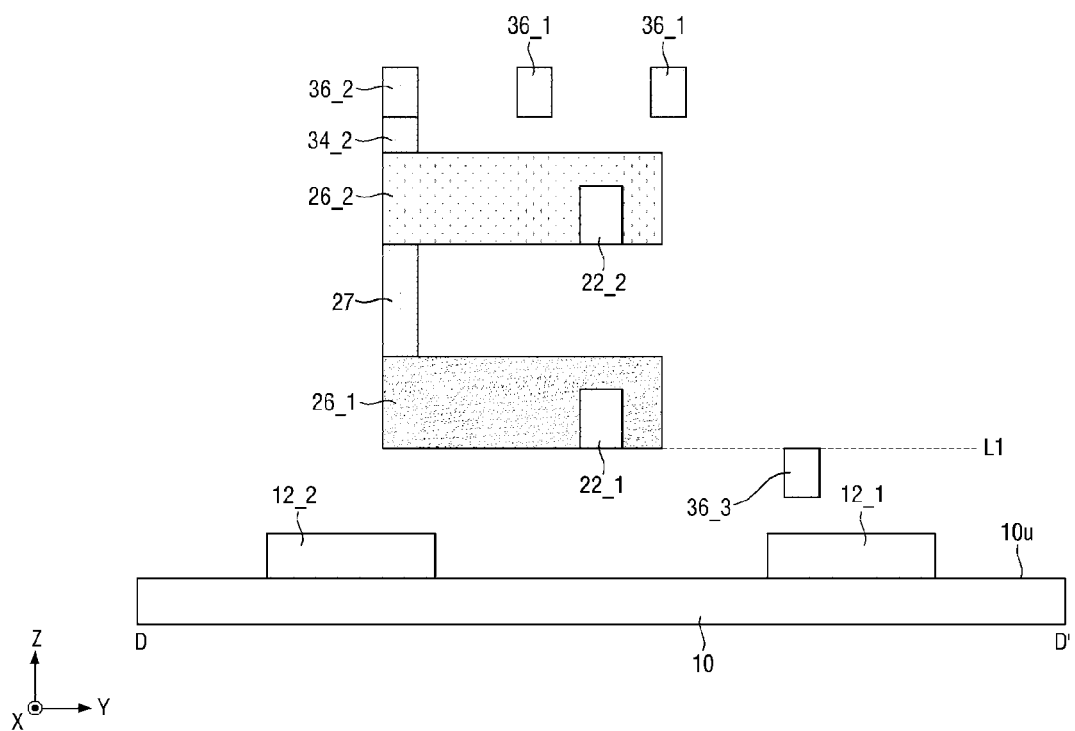
FIGS. 9A, 9B, and 9C are cross-sectional views taken along the lines D-D', E-E', and F-F' of FIGS. 6 and 7, respectively, according to some embodiments of the present inventive concept.
Figure 9B:
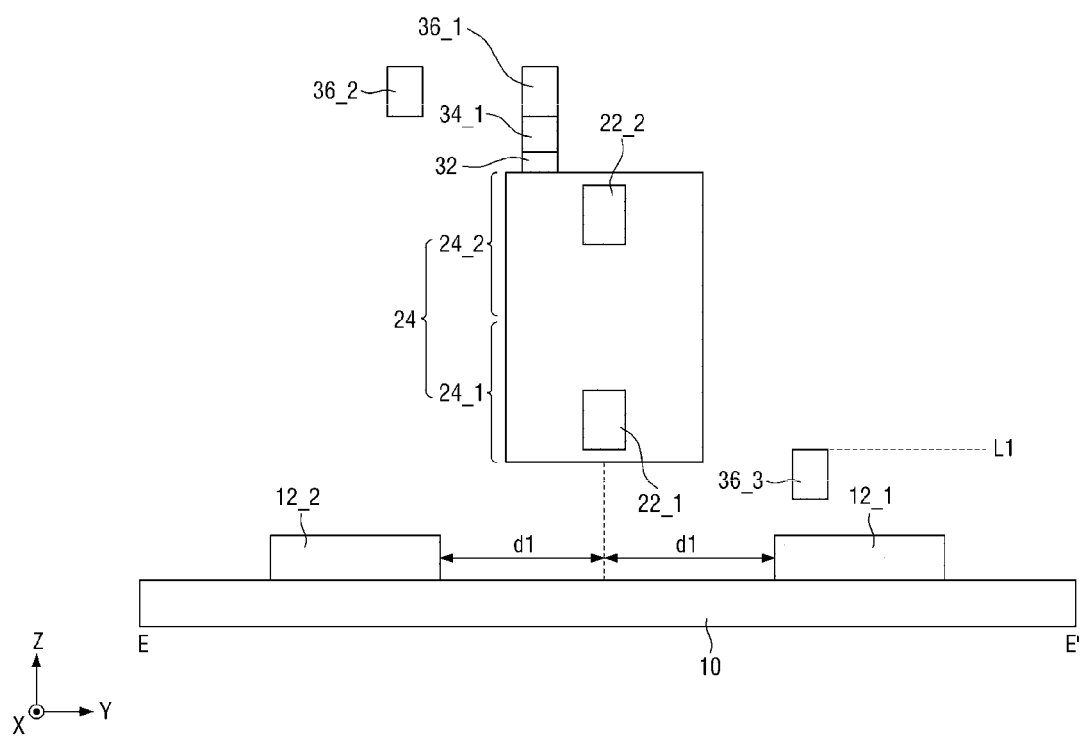
Figure 9C:
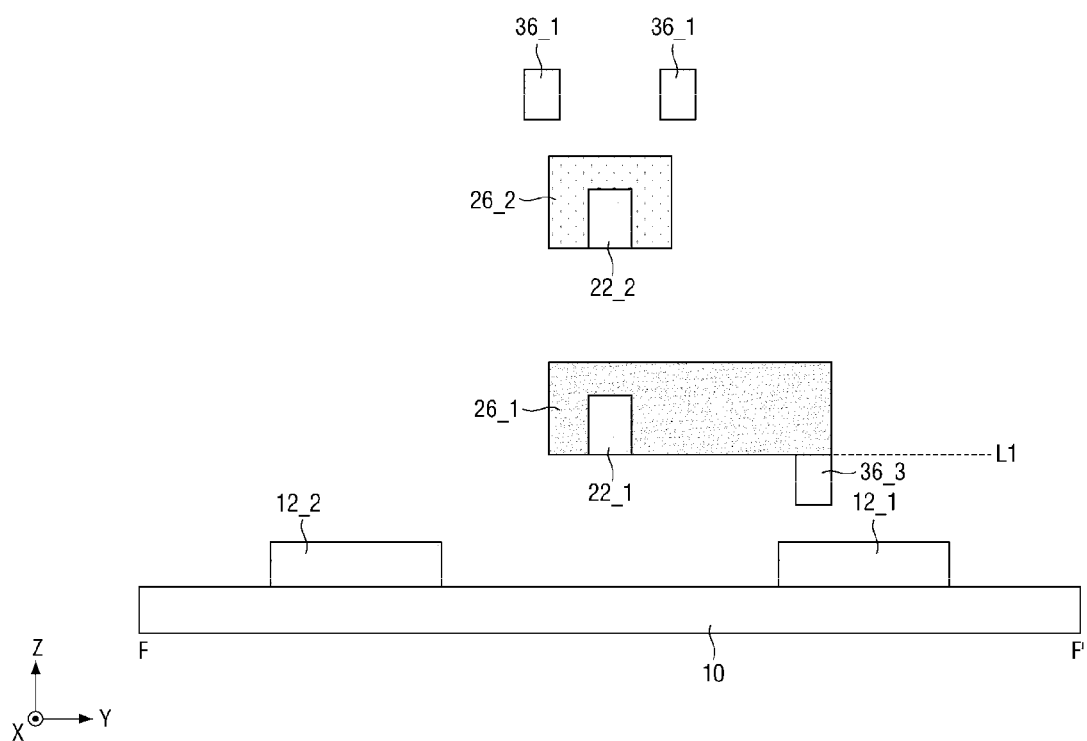

FIGS. 6 and 7 are layouts of the AOI of FIG. 1 according to some embodiments of the present inventive concept. Each of FIGS. 6 and 7 shows some elements (but not all elements) of the AOI for simplicity of illustration. FIG. 6 shows elements of an upper transistor region, and FIG. 7 shows elements of a lower transistor region. FIGS. 8, 9A, 9B, and 9C are views illustrating the AOI of FIGS. 6 and 7 according to some embodiments of the present inventive concept. FIG. 8 is a perspective view, and FIGS. 9A, 9B, and 9C are cross-sectional views taken along the lines D-D', E-E', and F-F' of FIGS. 6 and 7, respectively.

Referring to FIGS. 8, 9A, and 9C, the routing wire 36_3 may be closer to the substrate 10 than the input wires 36_1 and the output wire 36_2. The routing wire 36_3 may be between the upper surface 10u of the substrate 10 and a first level L1 of a lower surface of the lower source/drain region 26_1, and thus an upper surface of the routing wire 36_3 may not be farther from the substrate 10 than the lower surface of the lower source/drain region 26_1. In some embodiments, the upper surface of the routing wire 36_3 may be at the first level L1 as illustrated in FIGS. 9A and 9C. In some embodiments, the upper surface of the routing wire 36_3 may contact the lower source/drain region 26_1 as illustrated in FIG. 9C.

Referring to FIG. 9B, in some embodiments, a center of the gate structure 24 in the second direction Y may be spaced apart from the first power line 12_1 and the second power line 12_2 by an equal distance (e.g., a first distance d1).

Figure 10:
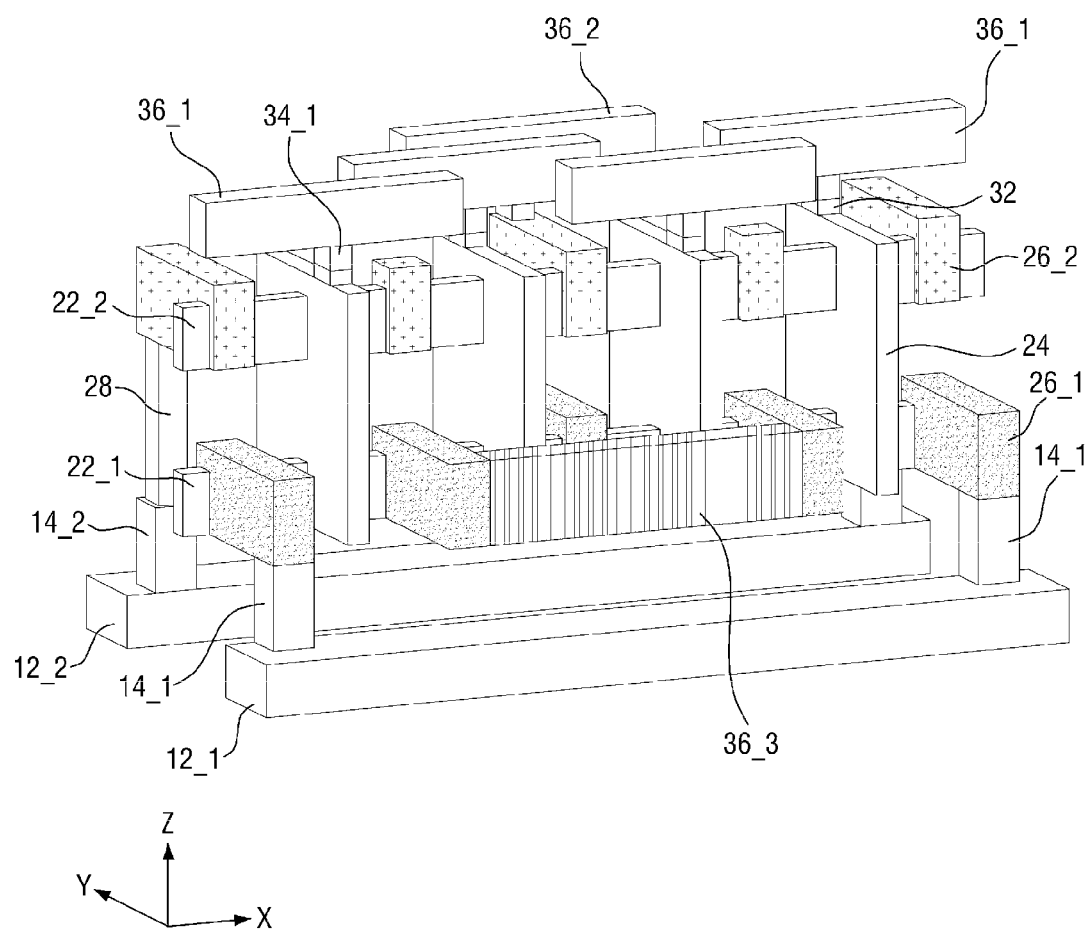
FIG. 10 is a perspective view of the AOI of FIGS. 6 and 7 according to some embodiments of the present inventive concept.
Figure 11A:
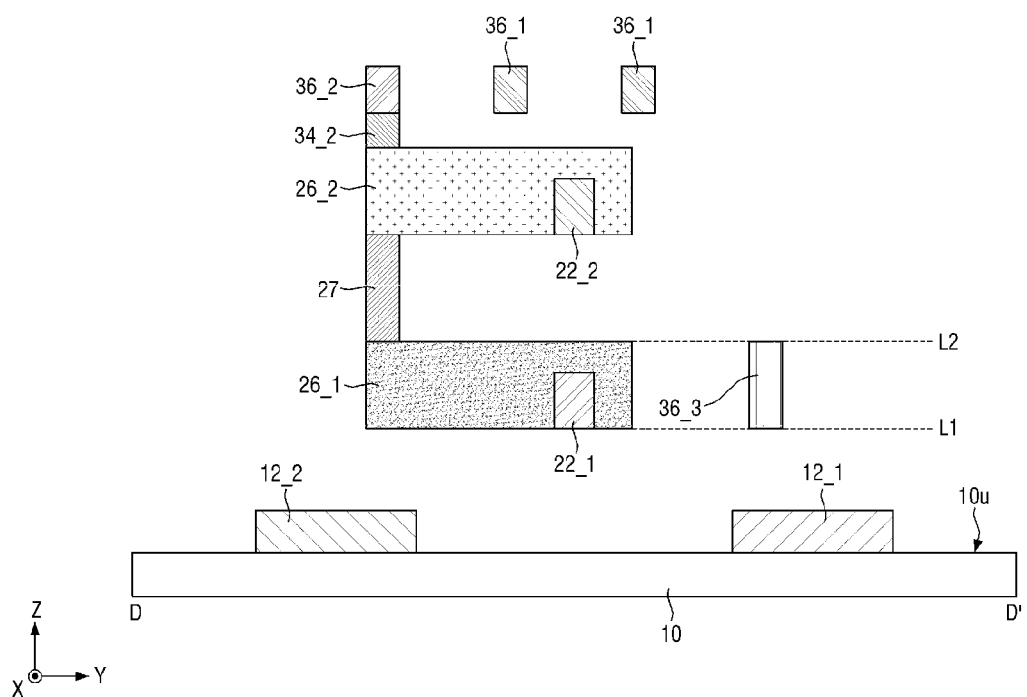
FIGS. 11A, 11B, and 11C are cross-sectional views taken along the lines D-D', E-E', and F-F' of FIGS. 6 and 7, respectively, according to some embodiments of the present inventive concept.
Figure 11B:
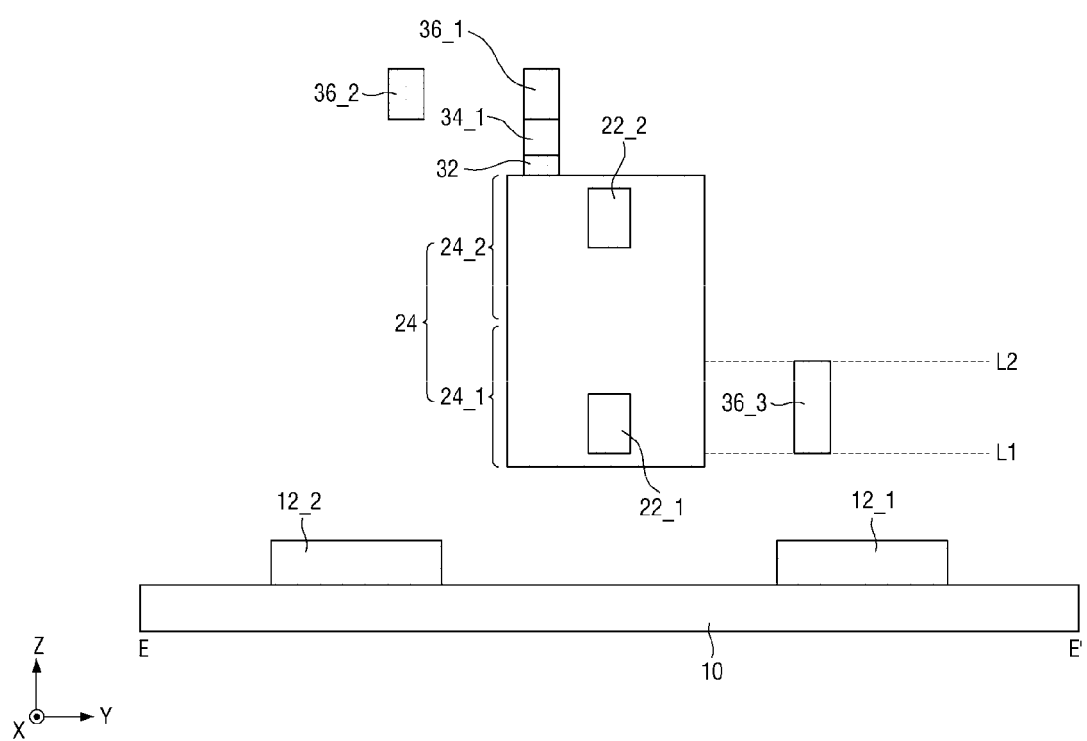
Figure 11C:
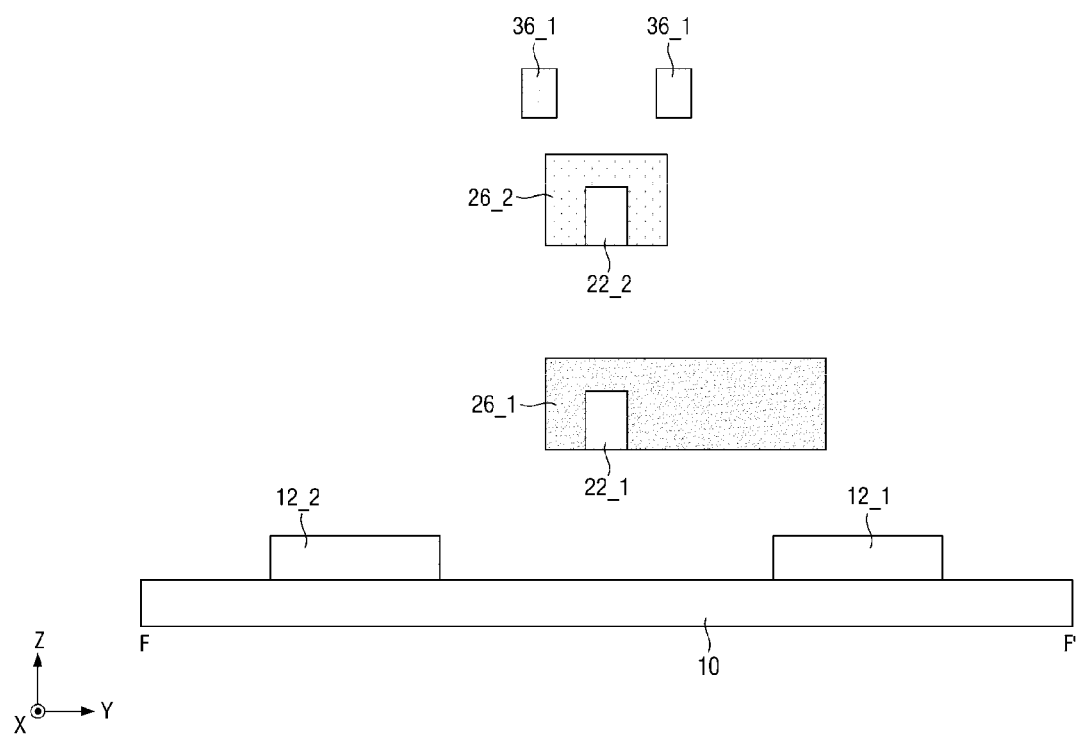

FIGS. 10, 11A, 11B, and 11C are views illustrating the AOI of FIGS. 6 and 7 according to some embodiments of the present inventive concept. FIG. 10 is a perspective view, and FIGS. 11A, 11B, and 11C are cross-sectional views taken along the lines D-D', E-E', and F-F' of FIGS. 6 and 7, respectively.

Referring to FIGS. 10 and 11A, the routing wire 36_3 may be between the first level L1 and a second level L2 of an upper surface of the lower source/drain region 26_1. In some embodiments, the routing wire 36_3 may contact sides of the lower source/drain regions 26_1 to electrically connect the lower source/drain regions 26_1 as illustrated in FIG. 10. FIGS. 10 and 11A show that the routing wire 36_3 has a thickness in the third direction Z equal to a thickness of the lower source/drain region 26_1 in the third direction Z and has a lower surface at the first level L1 and an upper surface at the second level L2 but the present inventive concept is not limited thereto. For example, the routing wire 36_3 may have the thickness in the third direction Z thinner than the thickness of the lower source/drain region 26_1 in the third direction Z.

Figure 12:
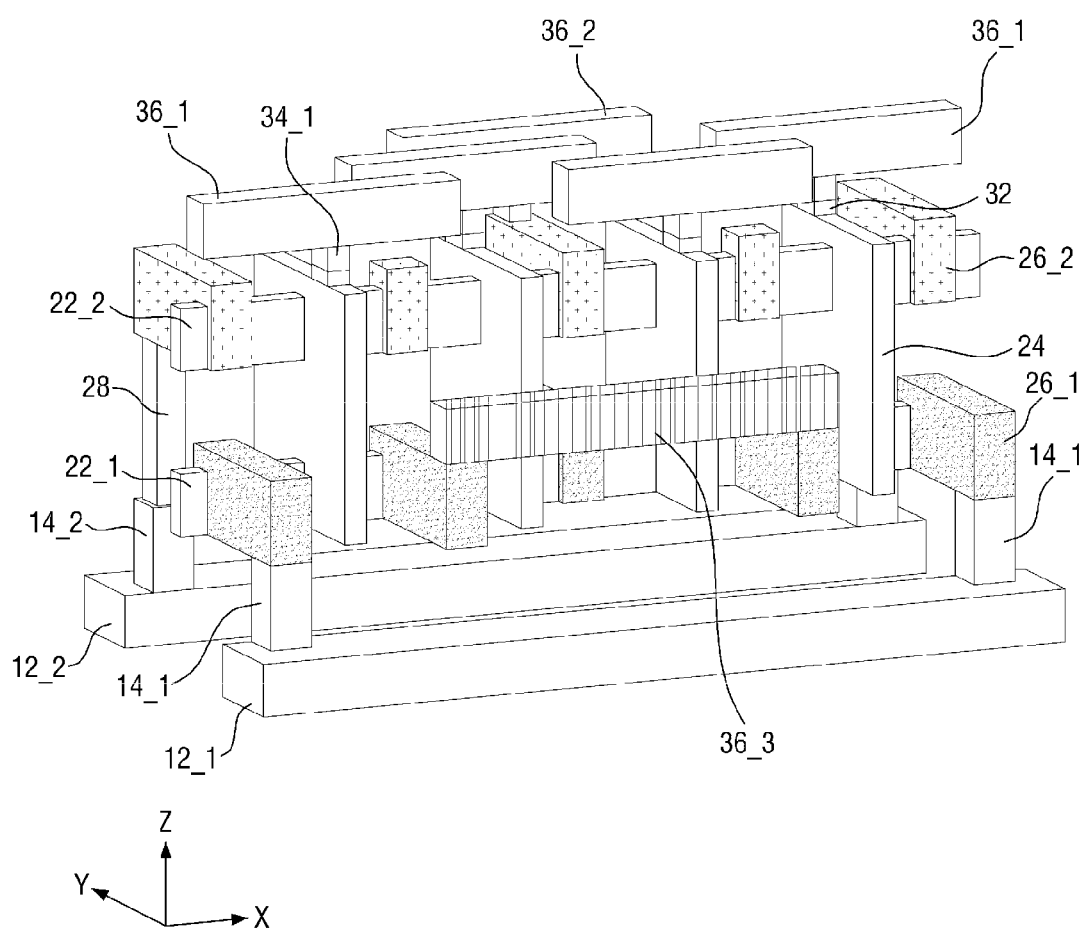
FIG. 12 is a perspective view of the AOI of FIGS. 6 and 7 according to some embodiments of the present inventive concept.
Figure 13A:
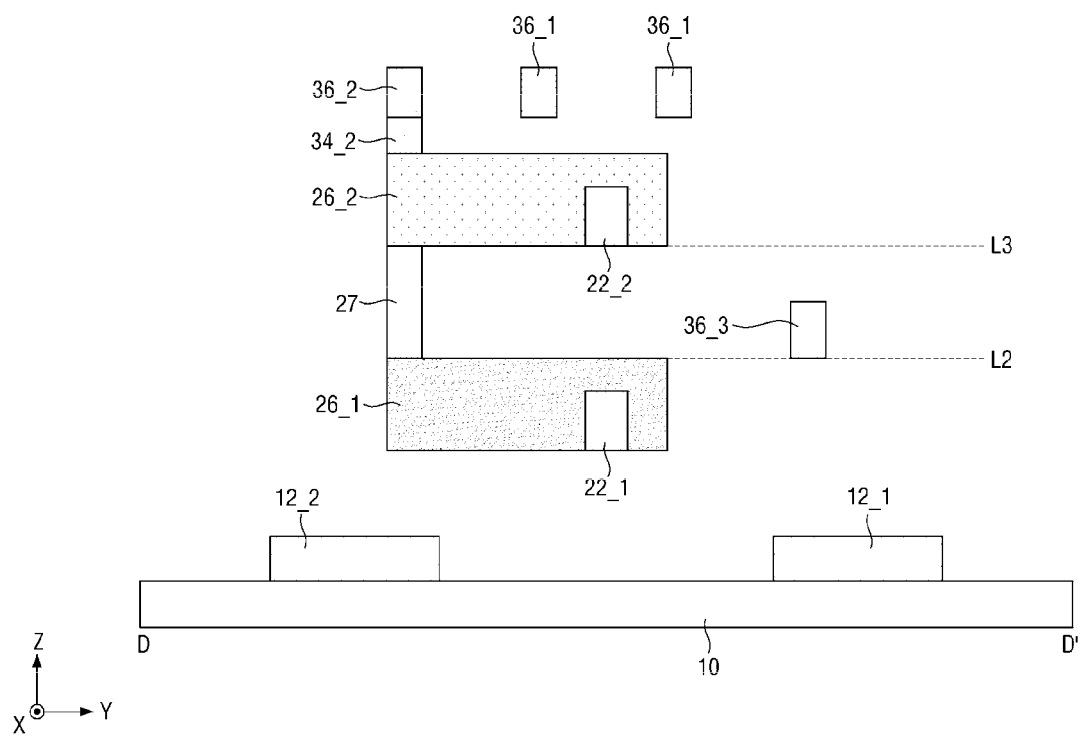
FIGS. 13A, 13B, and 13C are cross-sectional views taken along the lines D-D', E-E', and F-F' of FIGS. 6 and 7, respectively, according to some embodiments of the present inventive concept.
Figure 13B:
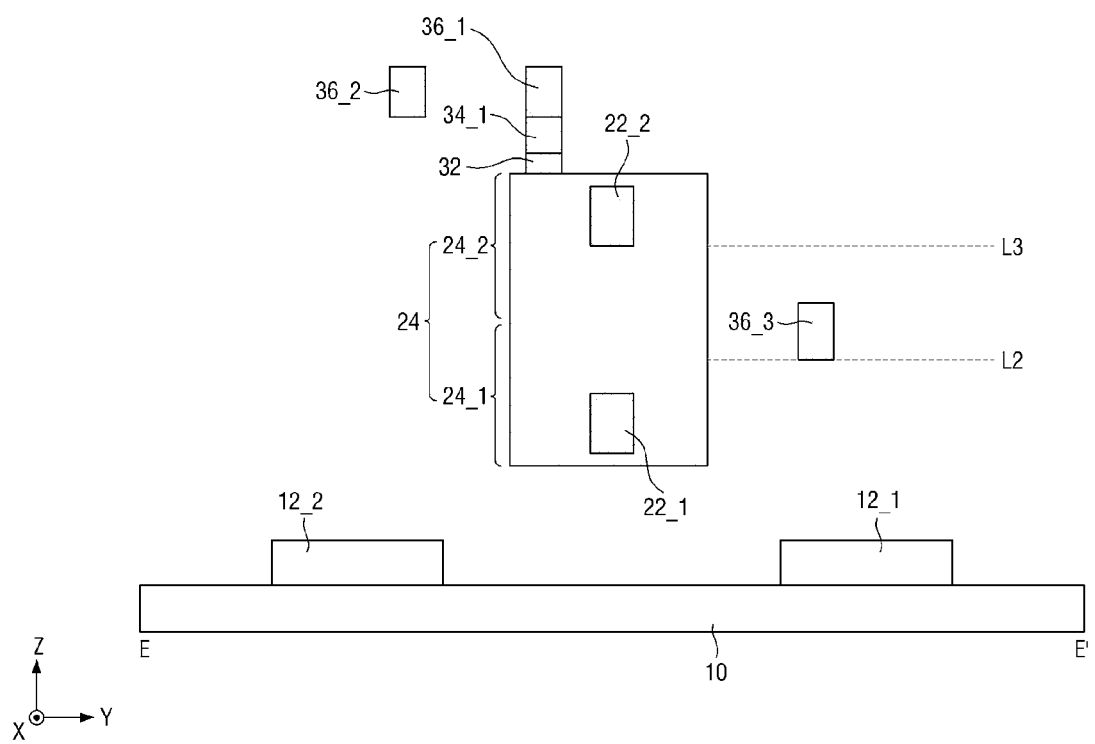
Figure 13C:
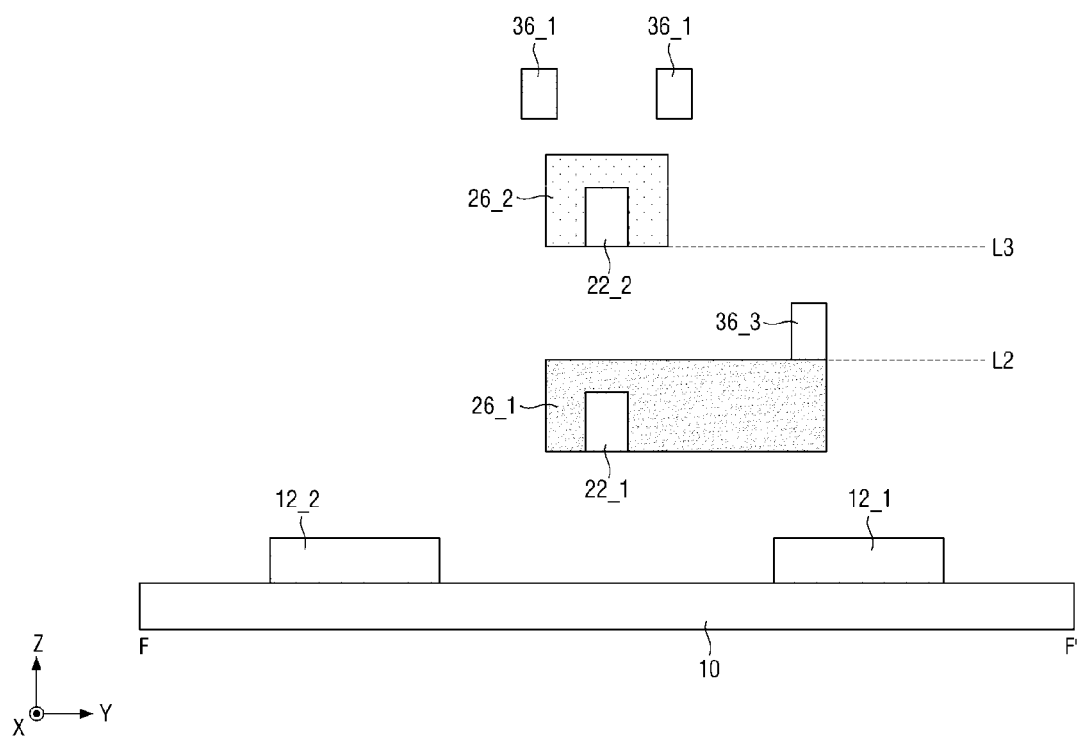

FIGS. 12, 13A, 13B, and 13C are views illustrating the AOI of FIGS. 6 and 7 according to some embodiments of the present inventive concept. FIG. 12 is a perspective view, and FIGS. 13A, 13B, and 13C are cross-sectional views taken along the lines D-D', E-E', and F-F' of FIGS. 6 and 7, respectively.

Referring to FIGS. 12, 13A, and 13C, the routing wire 36_3 may be between the second level L2 and a third level L3 of a lower surface of the upper source/drain region 26_2. In some embodiments, a lower surface of the routing wire 36_3 may be at the second level L2 as illustrated in FIGS. 12, 13A, and 13C but the present inventive concept is not limited thereto. In some embodiments, the lower surface of the routing wire 36_3 may be higher than the second level L2. In some embodiments, the lower surface of the routing wire 36_3 may contact the lower source/drain region 26_1 as illustrated in FIG. 13C.

Referring to FIG. 13B, the routing wire 36_3 may be provided between the lower active region 22_1 and the upper active region 22_2 in the third direction Z.

Figure 14:
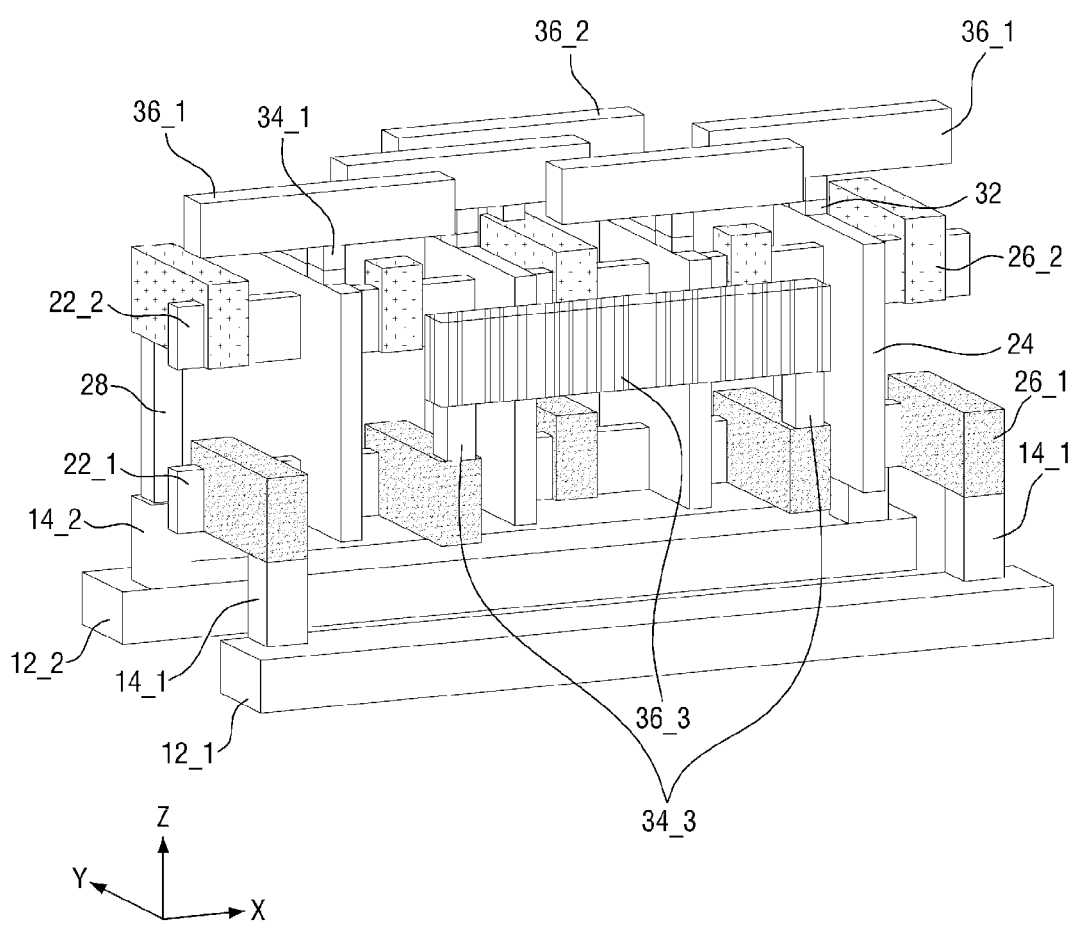
FIG. 14 is a perspective view of the AOI of FIGS. 6 and 7 according to some embodiments of the present inventive concept.
Figure 15A:
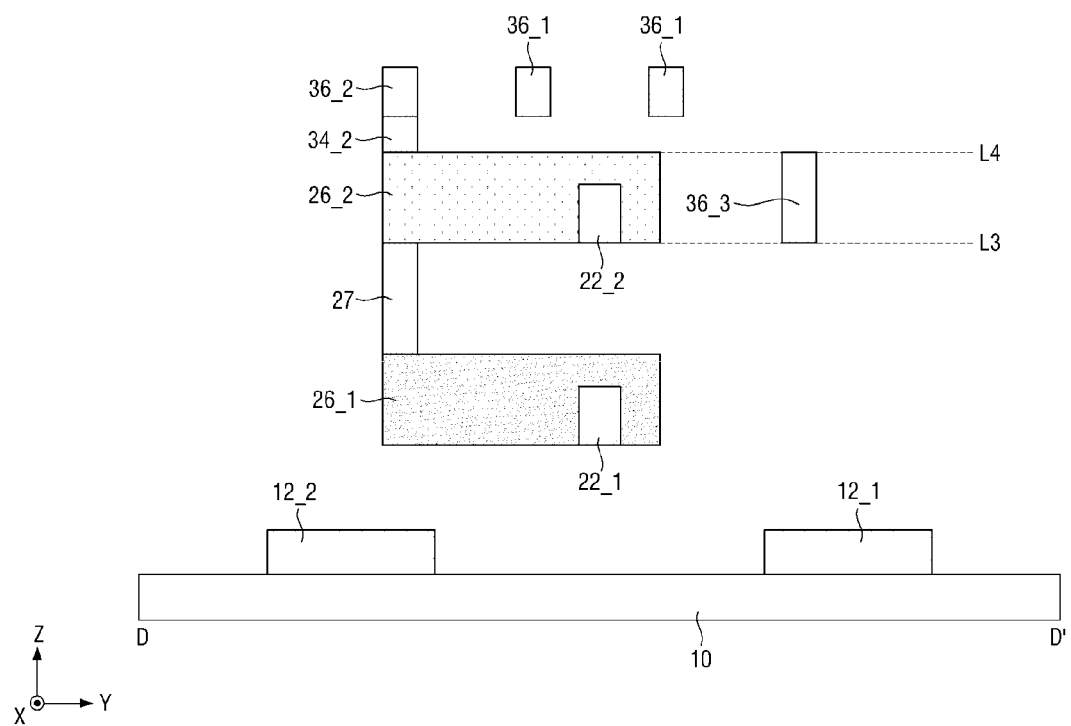
FIGS. 15A, 15B, and 15C are cross-sectional views taken along the lines D-D', E-E', and F-F' of FIGS. 6 and 7, respectively, according to some embodiments of the present inventive concept.
Figure 15B:
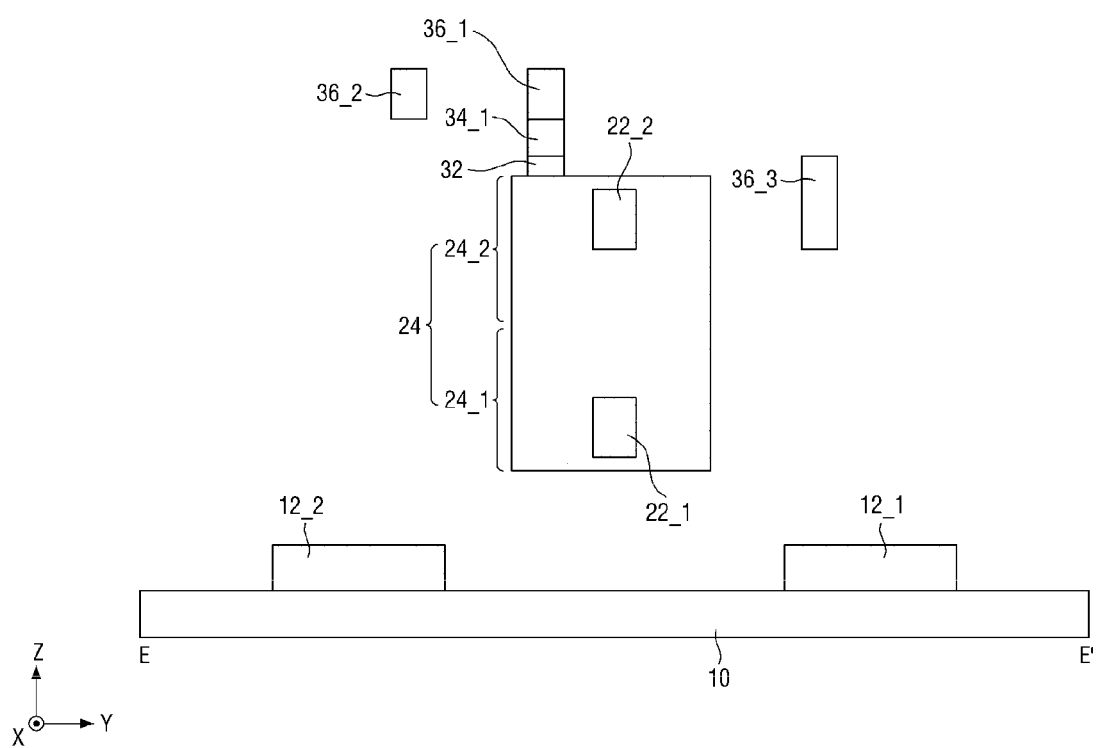
Figure 15C:
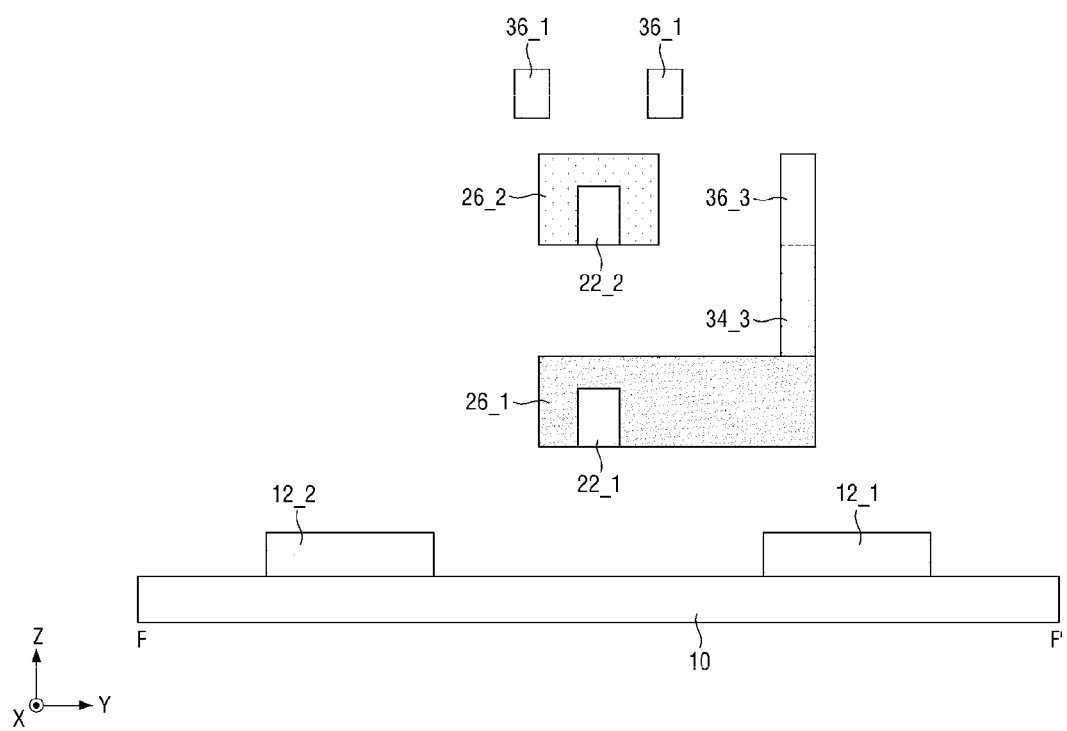

FIGS. 14, 15A, 15B, and 15C are views illustrating the AOI of FIGS. 6 and 7 according to some embodiments of the present inventive concept. FIG. 14 is a perspective view, and FIGS. 15A, 15B, and 15C are cross-sectional views taken along the lines D-D', E-E', and F-F' of FIGS. 6 and 7, respectively.

Referring to FIGS. 14 and 15A, the routing wire 36_3 may be between the third level L3 and a fourth level L4 of an upper surface of the upper source/drain region 26_2. FIGS. 14 and 15A show that the routing wire 36_3 has a thickness in the third direction Z equal to a thickness of the upper source/drain region 26_2 in the third direction Z and has a lower surface at the third level L3 and an upper surface at the fourth level L4 but the present inventive concept is not limited thereto. For example, the routing wire 36_3 may have the thickness in the third direction Z thinner than the thickness of the upper source/drain region 26_2 in the third direction Z, and the lower surface of the routing wire 36_3 may be higher than the third level L3.

Referring to FIGS. 14 and 15C, two wiring vias 34_3 may be provided between the routing wire 36_3 and the lower source/drain regions 26_1 and may electrically connect the routing wire 36_3 to the lower source/drain regions 26_1.

Figure 16:
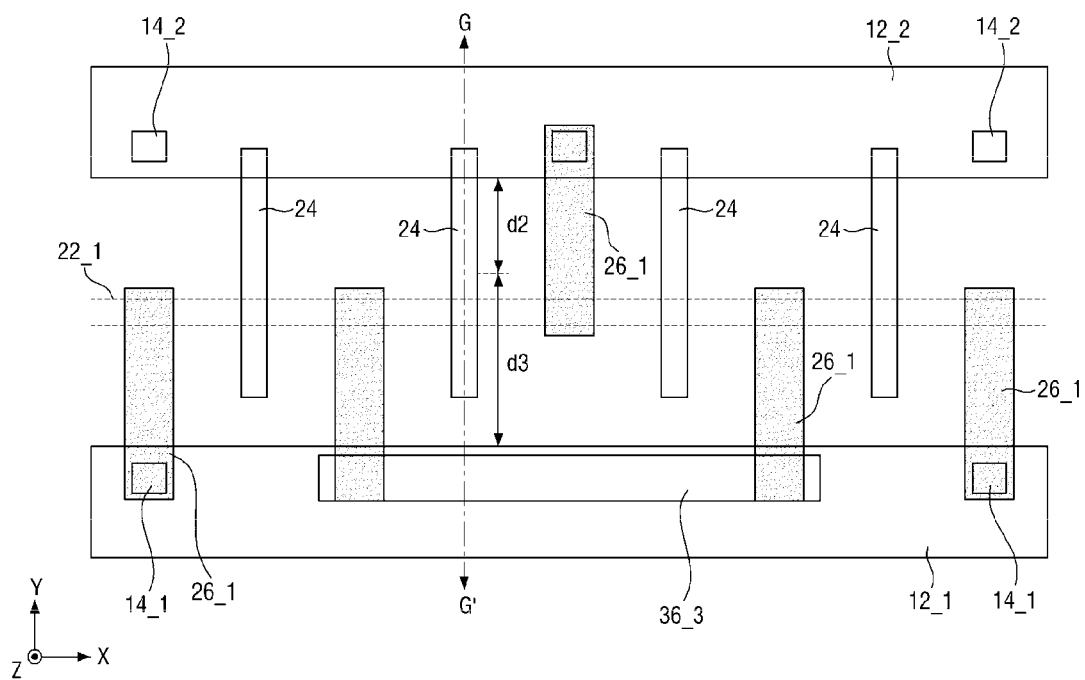
FIG. 16 is a layout of the AOI of FIG. 1 according to some embodiments of the present inventive concept.
Figure 17:
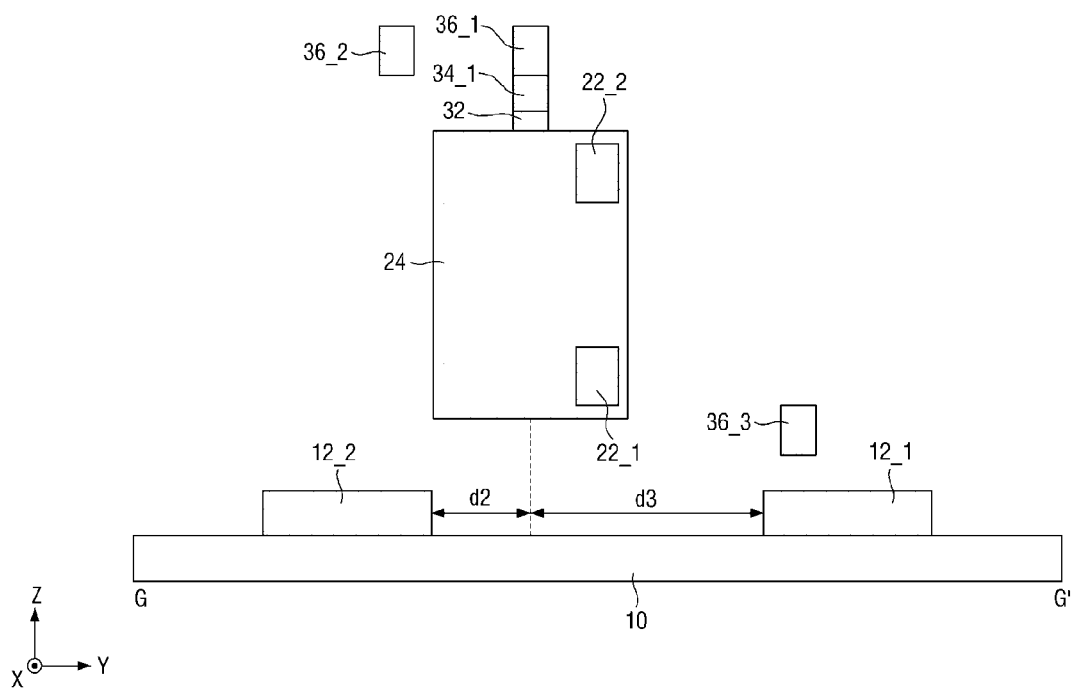
FIG. 17 is a cross-sectional view taken along the line G-G' of FIG. 16 according to some embodiments of the present inventive concept.

FIG. 16 is a layout of the AOI of FIG. 1 according to some embodiments of the present inventive concept, and FIG. 17 is a cross-sectional view taken along the line G-G' of FIG. 16 according to some embodiments of the present inventive concept. FIG. 16 shows elements of a lower transistor region and does not show some elements of the AOI for simplicity of illustration. A perspective view of the AOI of FIG. 16 may be similar to that of FIG. 8 except locations of gate structures 24.

Referring to FIGS. 16 and 17, a center of each of the gate structures 24 in the second direction Y may be closer to the second power line 12_2 than the first power line 12_1. The center of the gate structure 24 in the second direction Y may be spaced apart from the second power line 12_2 in the second direction Y by a second distance d2, and the center of the gate structure 24 in the second direction Y may be spaced apart from the first power line 12_1 in the second direction Y by a third distance d3 that is greater than the second distance d2. Accordingly, a distance between the routing wire 36_3 and the gate structure 24 may increase and may reduce interference and/or an electrical short between the gate structure 24 and the routing wire 36_3.

Figure 18:
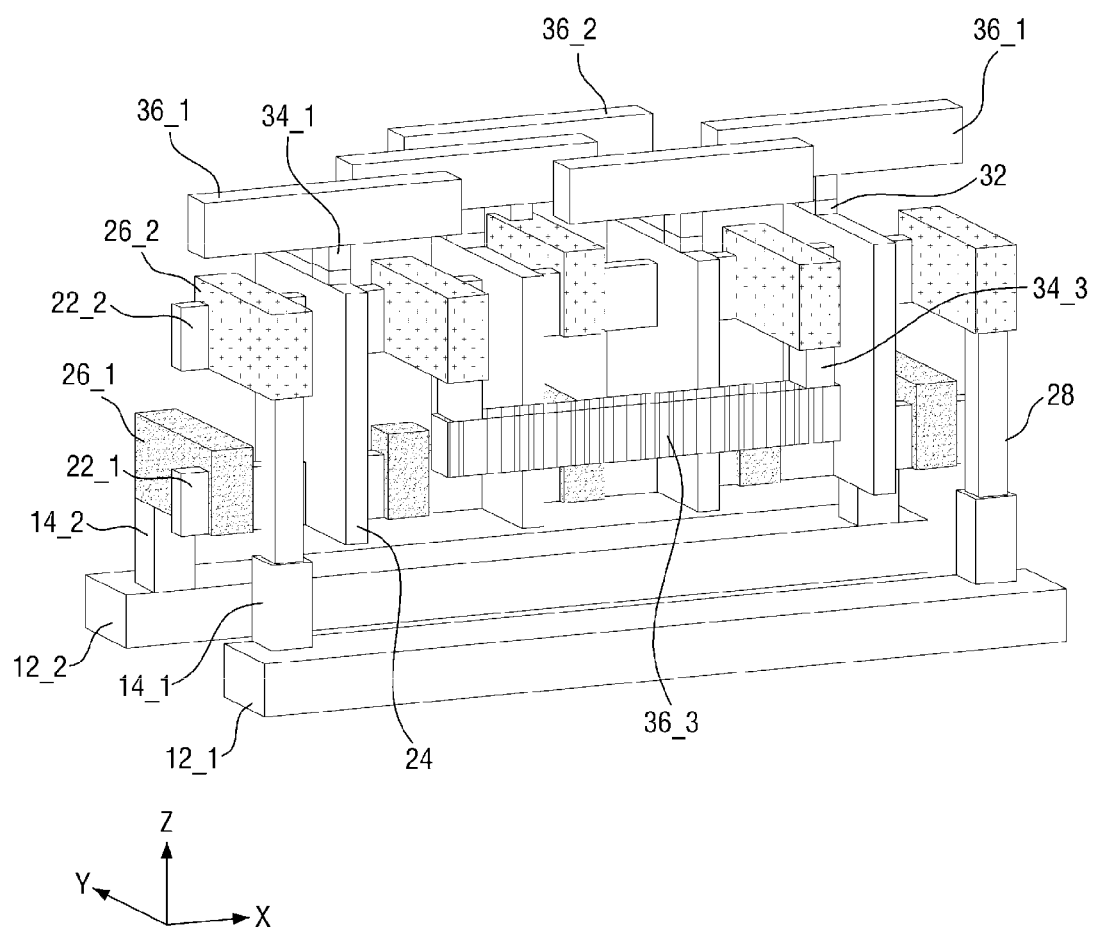
FIGS. 18 and 19 are perspective views of the AOI of FIG. 1 according to some embodiments of the present inventive concept.
Figure 19:
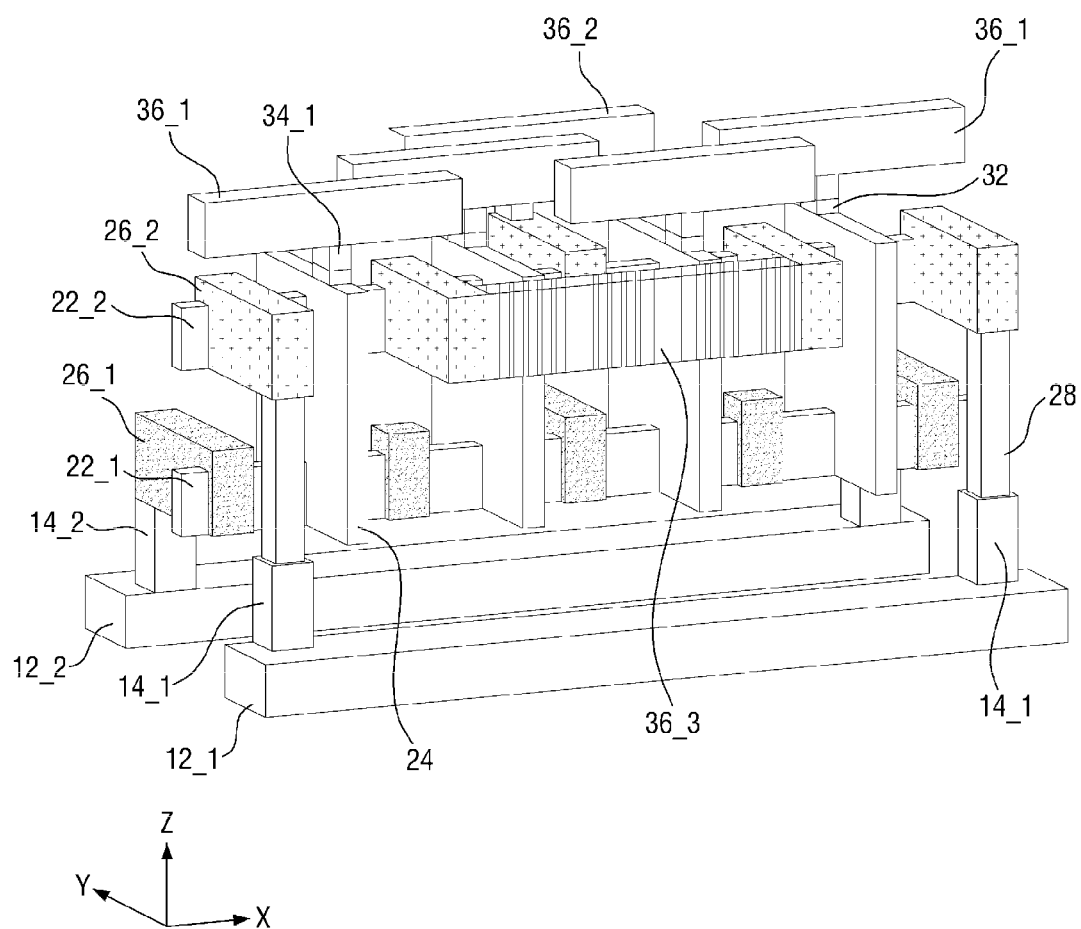

FIGS. 18 and 19 are perspective views of different embodiments of the AOI of FIG. 1. Referring to FIGS. 18 and 19, an upper transistor region (e.g., the upper transistor region 100_2 in FIG. 2) may include P-type transistors and a routing wire 36_3 may electrically connect two upper source/drain regions 26_2. The routing wire 36_3 may be closer to a substrate (e.g., the substrate 10 in FIG. 5A) than an input wire 36_1. In some embodiments, an upper surface of the routing wire 36_3 may be closer to the substrate than an upper surface of the input wire 36_1. The routing wire 36_3 may be provided at any locations described with reference to FIGS. 8 through 15C.

Referring to FIG. 18, the routing wire 36_3 may be provided between a lower surface of an upper source/drain region 26_2 and an upper surface of a lower source/drain region 26_1 (i.e., between the second level L2 and the third level L3 in FIG. 13A). Two wiring vias 34_3 may be provided between the routing wire 36_3 and the upper source/drain regions 26_2 and may electrically connect the upper source/drain regions 26_2 to the routing wire 36_3. The routing wire 36_3 may extend in the first direction X as illustrated in FIG. 18.

Referring to FIG. 19, the routing wire 36_3 may be provided between a lower surface of an upper source/drain region 26_2 and an upper surface of the upper source/drain region 26_2 (i.e., between the third level L3 and the fourth level L4 in FIG. 15A). In some embodiments, the routing wire 36_3 may have a thickness in the third direction Z equal to a thickness of the upper source/drain region 26_2 in the third direction Z as illustrated in FIG. 19 but the present inventive concept is not limited thereto. For example, the routing wire 36_3 may have the thickness in the third direction Z thinner than the thickness of the upper source/drain region 26_2 in the third direction Z, and the lower surface of the routing wire 36_3 may be higher than the third level L3.

Figure 20:
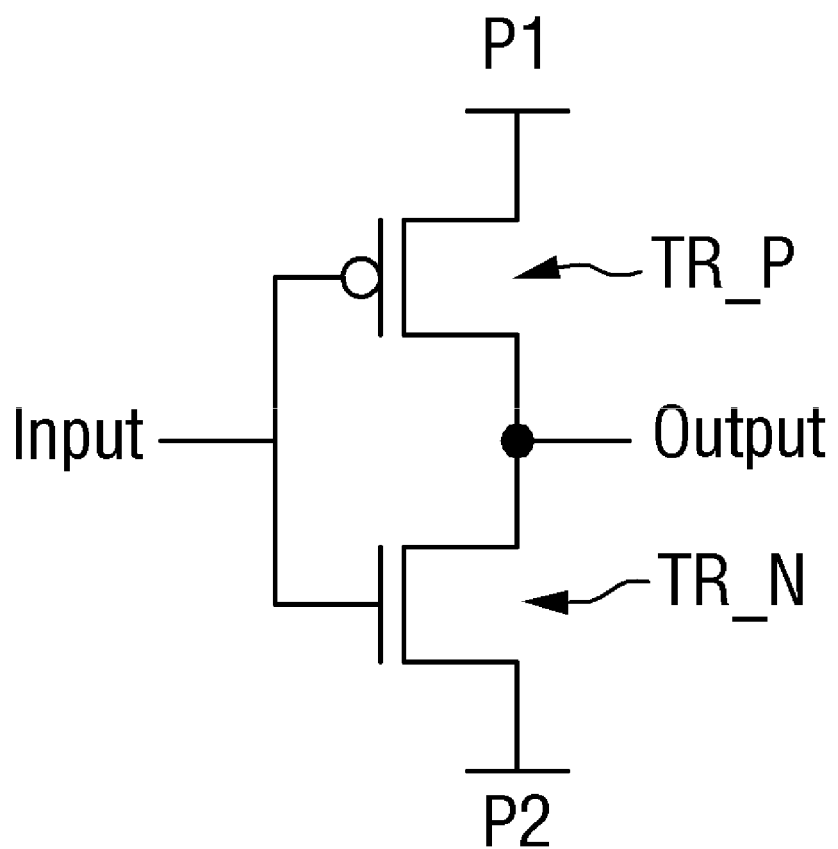
FIG. 20 is a circuit diagram of an inverter.
Figure 21:
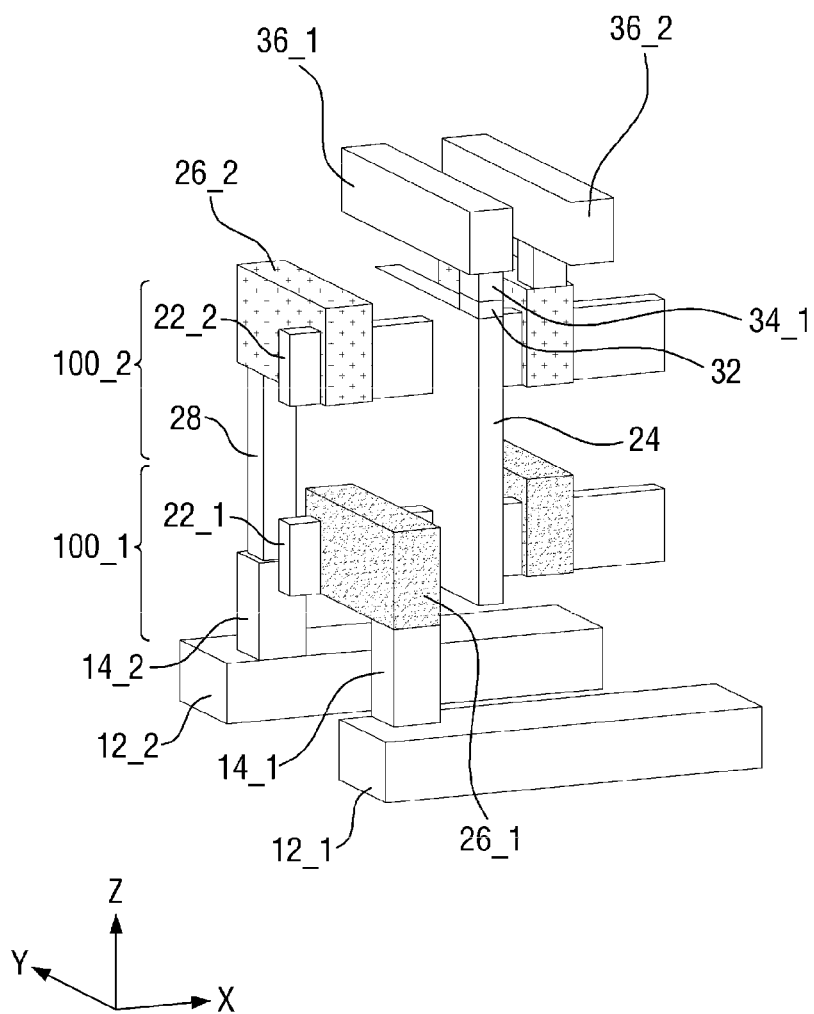
FIG. 21 is a perspective view of the inverter of FIG. 20 according to some embodiments of the present inventive concept.
Figure 22A:
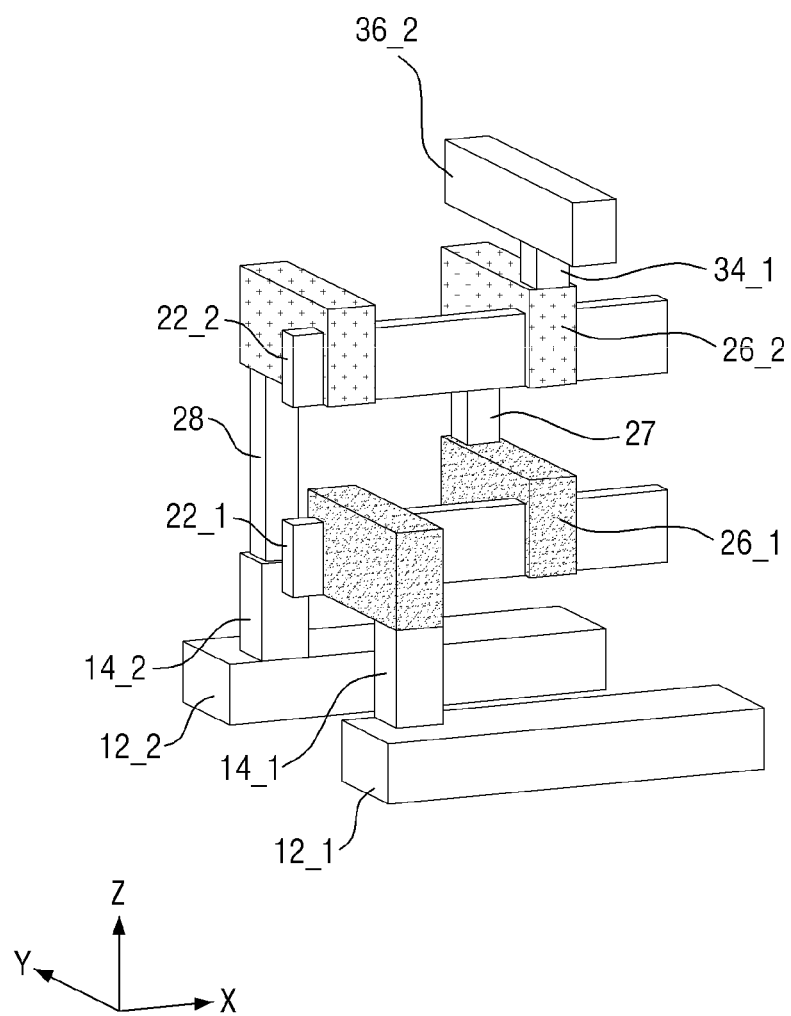
FIGS. 22A and 22B are perspective views of the inverter in FIG. 21 showing a group of elements of FIG. 21.
Figure 22B:
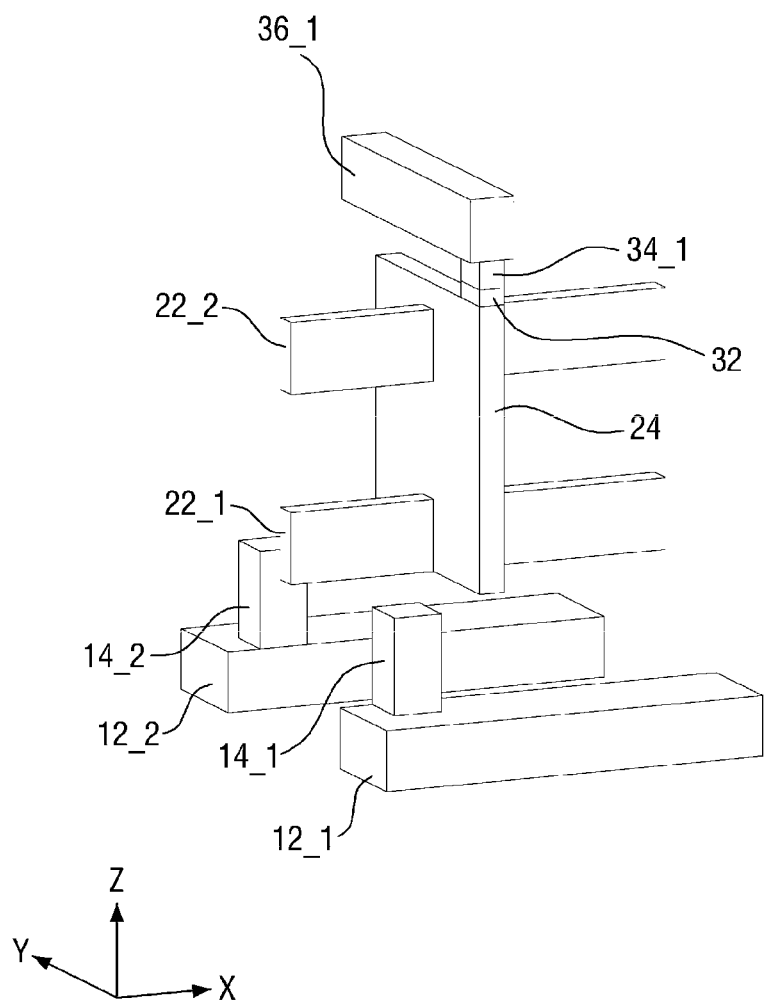
Figure 23:
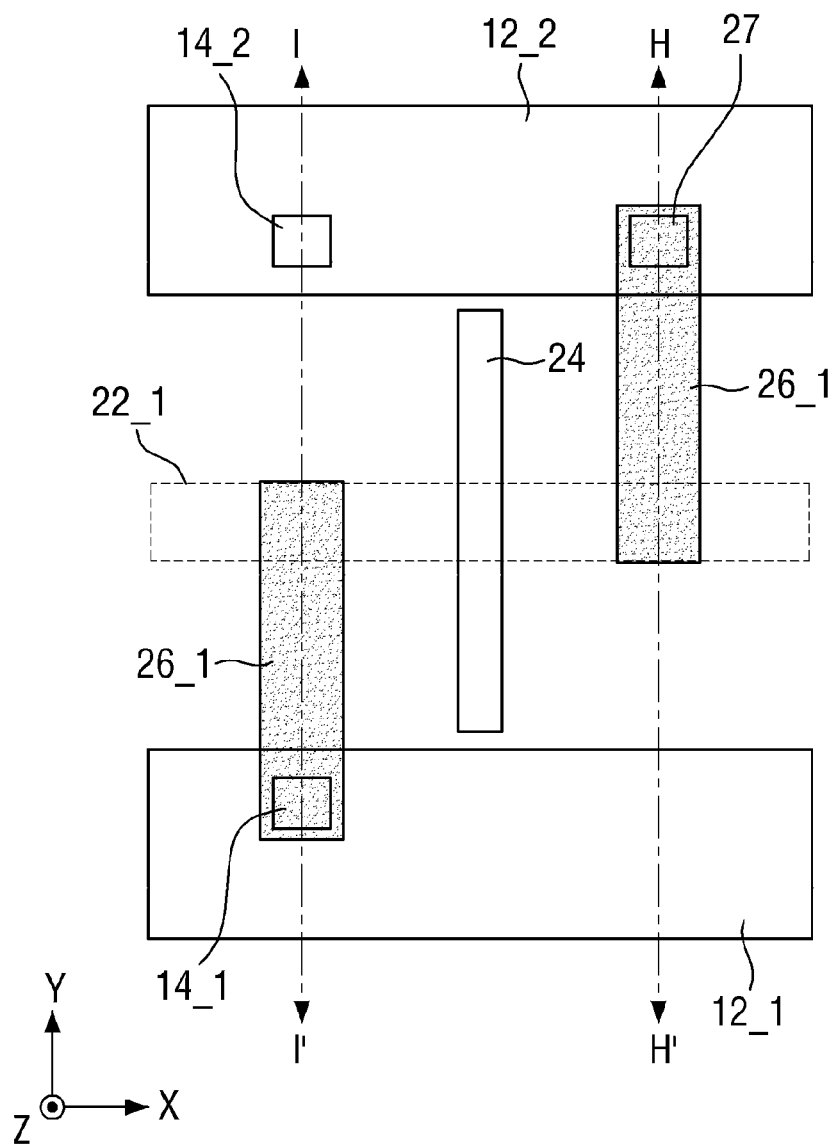
FIGS. 23 and 24 are layouts of the inverter of FIG. 21 according to some embodiments of the present inventive concept.
Figure 24:
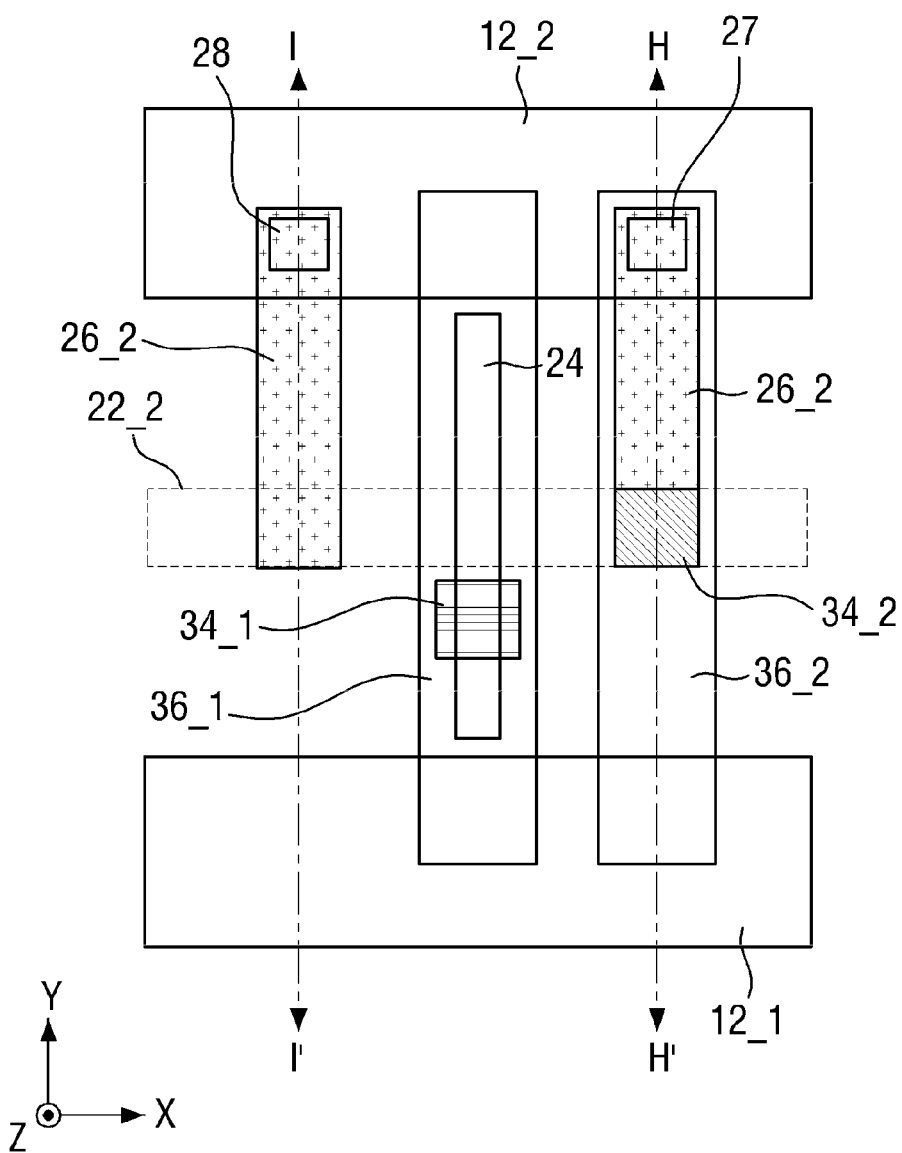
Figure 25A:
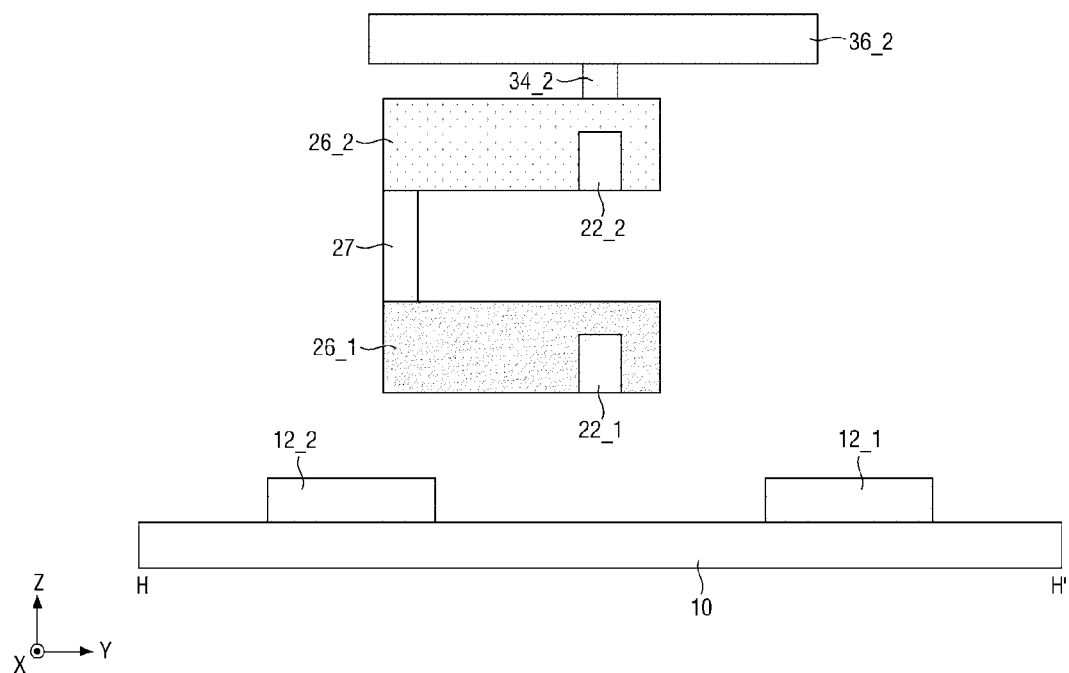
FIGS. 25A and 25B are cross-sectional views taken along the lines H-H' and I-I' of FIGS. 23 and 24, respectively, according to some embodiments of the present inventive concept.
Figure 25B:
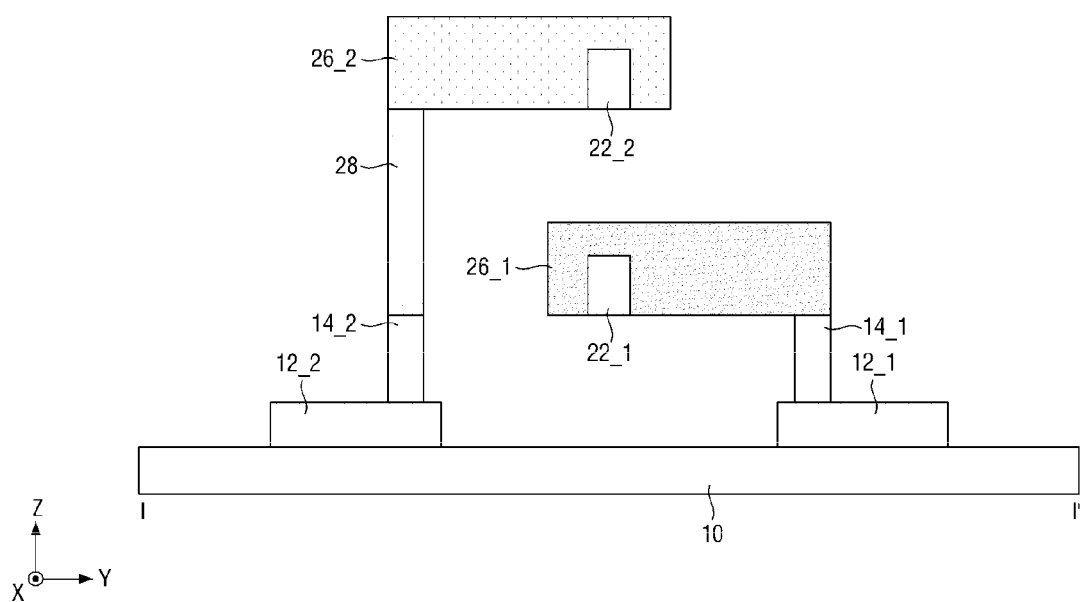

FIG. 20 is a circuit diagram of an inverter. FIG. 21 is a perspective view of the inverter of FIG. 20 according to some embodiments of the present inventive concept, and each of FIGS. 22A and 22B is a perspective view of the inverter of FIG. 21. FIG. 21 is divided into FIGS. 22A and 22B to simplify the drawings, and each of FIGS. 22A and 22B shows some elements (but not all elements) of FIG. 21. FIGS. 23 and 24 are layouts of the inverter of FIG. 21. Each of FIGS. 23 and 24 shows some elements (but not all elements) of the inverter of FIG. 21 for simplicity of illustration. FIG. 23 shows elements of a lower transistor region, and FIG. 24 shows elements of an upper transistor region. FIGS. 25A and 25B are cross-sectional views taken along the lines H-H' and I-I' of FIGS. 23 and 24, respectively.

Referring to FIGS. 20, 21, 22A and 22B, the inverter may be a stacked device including a lower transistor region 100_1 and an upper transistor region 100_2. The lower transistor region 100_1 may include an N-type transistor TR_N, and the upper transistor region 100_2 may include a P-type transistor TR_P. The N-type transistor TR_N and the P-type transistor TR_P may be configured to receive a common input Input and may be configured to output a common output Output. The P-type transistor TR_P may be connected to a first power P1, and the N-type transistor TR_N may be connected to a second power P2. Although not illustrated, various insulating layers may be provided between elements for electrical isolation of these elements.

The inverter may include a first power line 12_1 and a second power line 12_2 that may extend in the first direction X and may be spaced apart from each other in a second direction Y. The first power line 12_1 may be connected to the first power P1 having a first voltage (e.g., a drain voltage), and the second power line 12_2 may be connected to the second power P2 having a second voltage (e.g., a source voltage). First power vias 14_1 may be provided on the first power line 12_1 and may electrically connect the first power line 12_1 to other elements (e.g., a lower source/drain region 26_1). Second power vias 14_2 may be provided on the second power line 12_2 and may electrically connect the second power line 12_2 to other elements (e.g., an upper source/drain region 26_2).

The lower transistor region 100_1 may include a lower active region 22_1 that may extend in the first direction X and two lower source/drain regions 26_1 that may contact the lower active region 22_1. The lower source/drain regions 26_1 may be spaced apart from each other in the first direction X.

The upper transistor region 100_2 may include an upper active region 22_2 that may extend in the first direction X and two upper source/drain regions 26_2 that may contact the upper active region 22_2. The upper source/drain regions 26_2 may be spaced apart from each other in the first direction X.

A gate structure 24 that may contact the lower active region 22_1 and the upper active region 22_2 may be provided. A lower portion of the gate structure 24 may be between the lower source/drain regions 26_1, and an upper portion of the gate structure 24 may be between the upper source/drain regions 26_2.

An input wire 36_1 may be provided on the gate structure 24 and may be electrically connected to the gate structure 24. A gate contact 32 and an input via 34_1 may be provided between the gate structure 24 and the input wire 36_1 and may electrically connect the input wire 36_1 to the gate structure 24. The input wire 36_1 may extend in the second direction Y.

An output wire 36_2 may be provided on the upper source/drain region 26_2 and may extend in the second direction Y. The output wire 36_2 may be electrically connected to the lower source/drain region 26_1 through the upper source/drain region 26_2 and a source/drain contact (e.g. via) 27.

A power contact 28 may be provided on the second power line 12_2 and may electrically connect the upper source/drain region 26_2 to the second power line 12_2.

Figure 26:
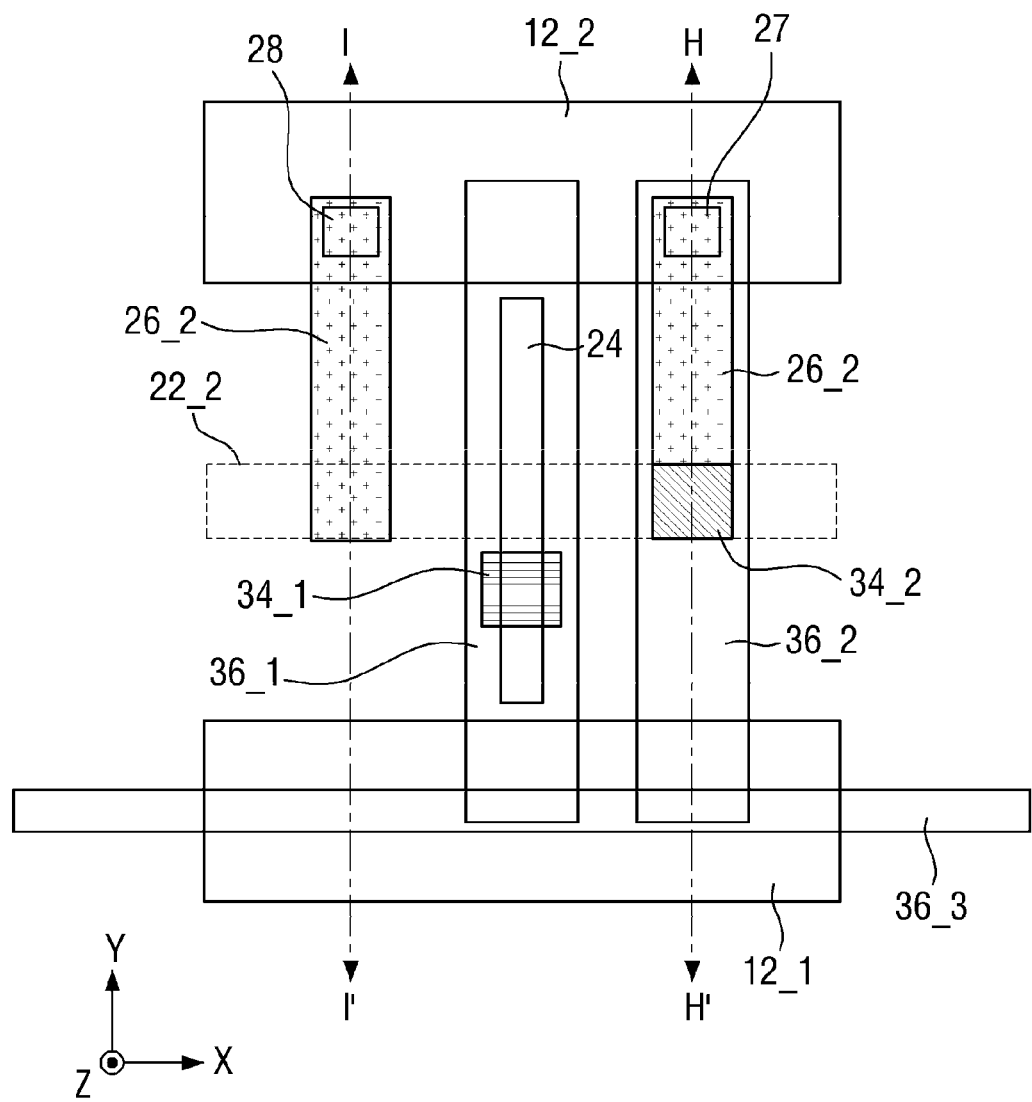
FIG. 26 is a layout of an upper transistor region of the inverter of FIG. 21 according to some embodiments of the present inventive concept.
Figure 27A:
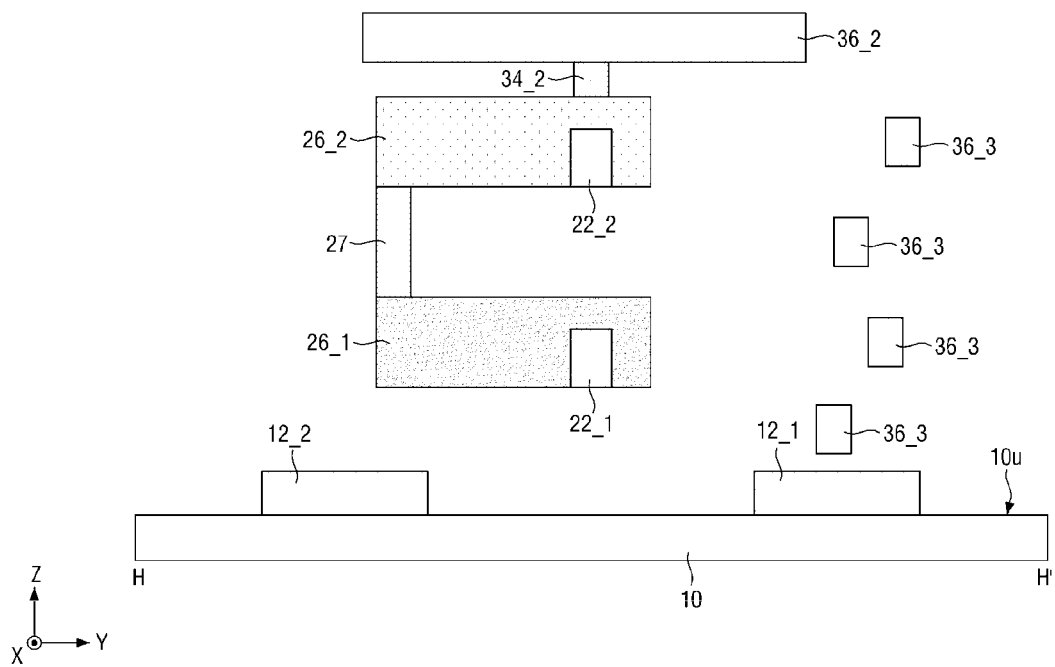
FIGS. 27A and 27B are cross-sectional views taken along the lines H-H' and I-I' of FIG. 26, respectively, according to some embodiments of the present inventive concept.
Figure 27B:
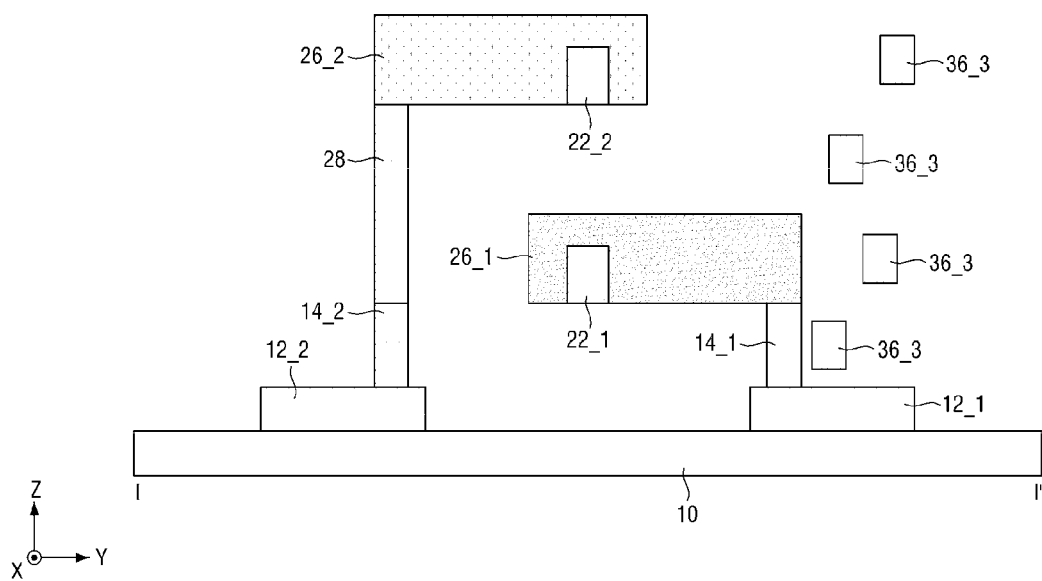

FIG. 26 is a layout of an upper transistor region of the inverter of FIG. 21 according to some embodiments of the present inventive concept, and FIGS. 27A and 27B are cross-sectional views taken along the lines H-H' and I-I' of FIG. 26, respectively. The inverter illustrated in FIGS. 26, 27A, and 27B may be similar to the inverter illustrated in FIGS. 21 through 25B except additional routing wires 36_3.

Referring to FIGS. 26, 27A, and 27B, one or more of routing wires 36_3 may be provided between an upper surface 10u of a substrate 10 and an upper surface of the upper source/drain region 26_2. In some embodiments, an upper surface of the routing wires 36_3 may not be farther from the substrate 10 than an upper surface of the upper source/drain region 26_2. In some embodiments, the routing wires 36_3 may be provided on only one side of the upper source/drain region 26_2 as illustrated in FIGS. 27A and 27B. Each of the routing wires 36_3 may electrically connect two elements of an integrated circuit device that includes the inverter.

Figure 28:
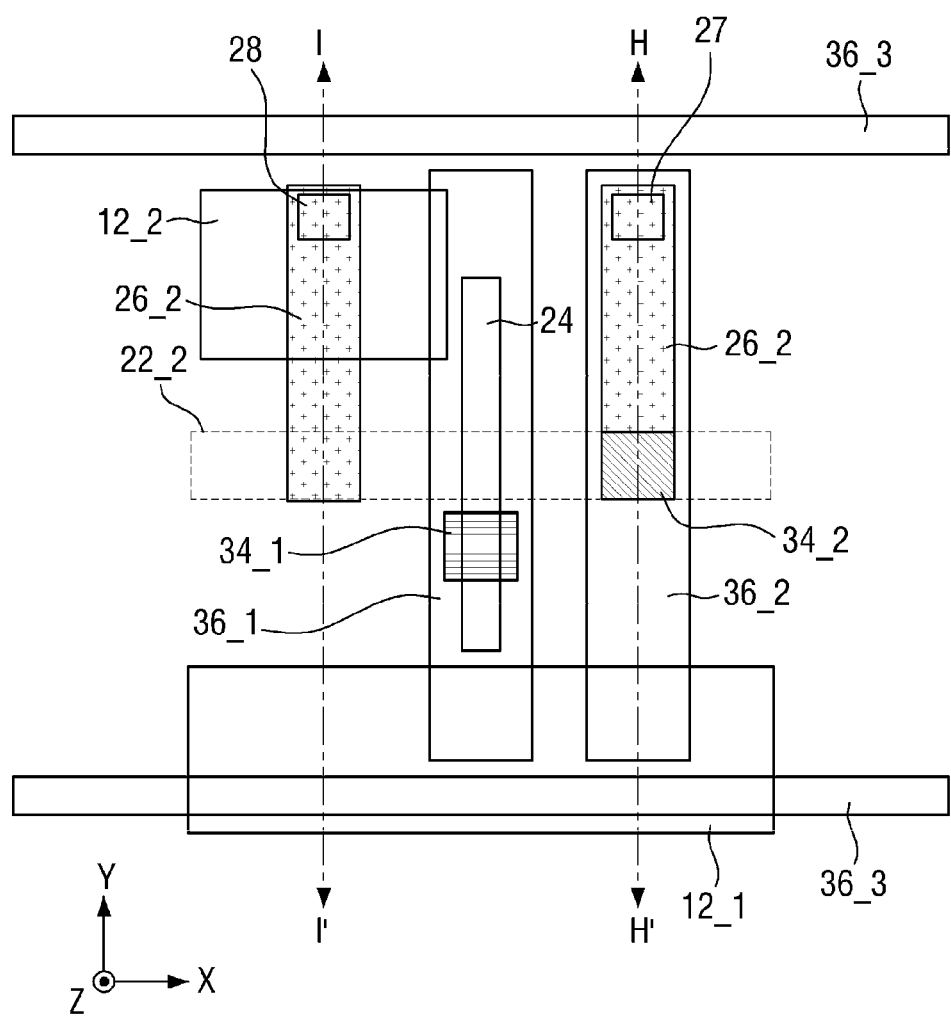
FIG. 28 is a layout of an upper transistor region of the inverter of FIG. 21 according to some embodiments of the present inventive concept.
Figure 29A:
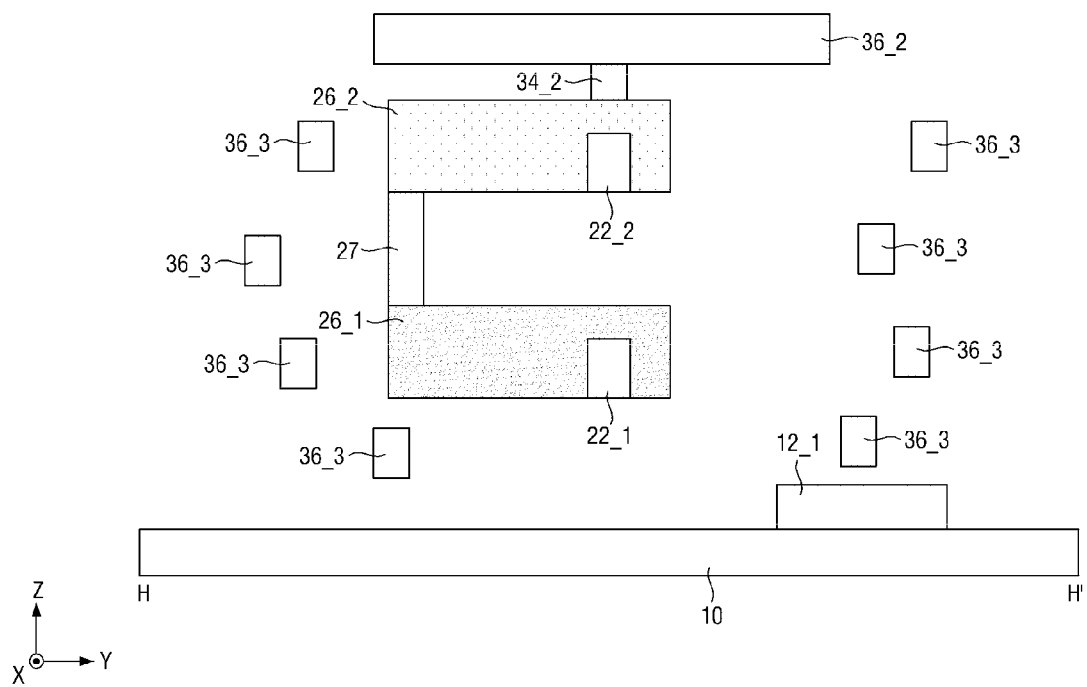
FIGS. 29A and 29B are cross-sectional views taken along the lines H-H' and I-I' of FIG. 28, respectively, according to some embodiments of the present inventive concept.
Figure 29B:
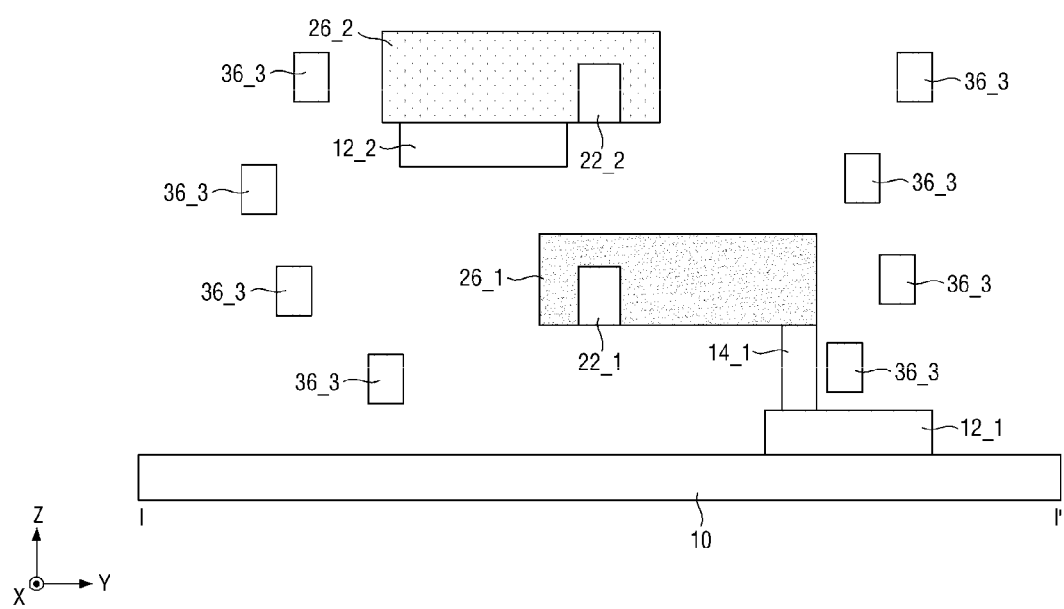

FIG. 28 is a layout of an upper transistor region of the inverter of FIG. 21 according to some embodiments of the present inventive concept, and FIGS. 29A and 29B are cross-sectional views taken along the lines G-G' and H-H' of FIG. 28, respectively. The inverter illustrated in FIGS. 28, 29A, and 29B may be similar to the inverter illustrated in FIGS. 21 through 25B except additional routing wires 36_3 and a location of a second power line 12_2.

Referring to FIGS. 28 and 29B, the second power line 12_2 may be overlapped by the upper source/drain region 26_2. In some embodiments, the second power line 12_2 may contact the upper source/drain region 26_2 as illustrated in FIG. 29B, and a power contact and a second power via (e.g., the power contact 28 and the second power via 14_2 in FIG. 27B) may be omitted. The routing wires 36_3 may be provided on both sides of the upper source/drain region 26_2 as illustrated in FIGS. 29A and 29B.

Figure 30:
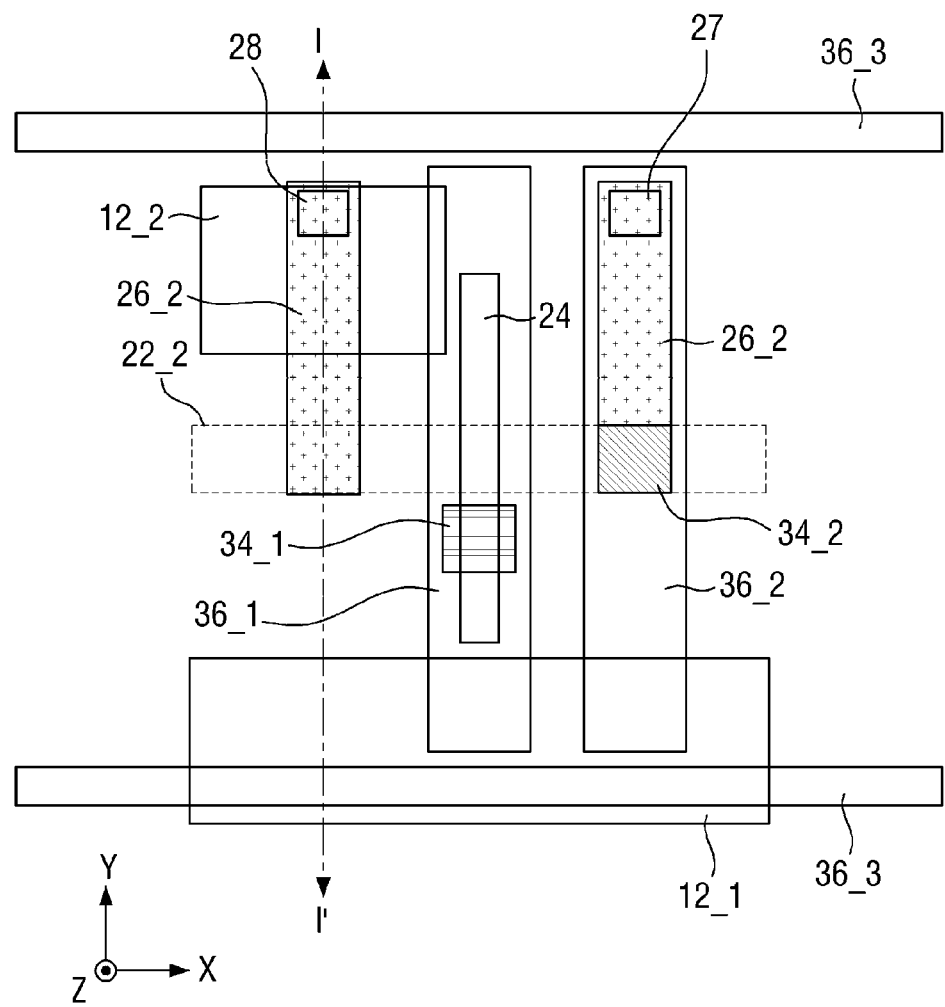
FIG. 30 is a layout of an upper transistor region of the inverter of FIG. 21 according to some embodiments of the present inventive concept.
Figure 31:
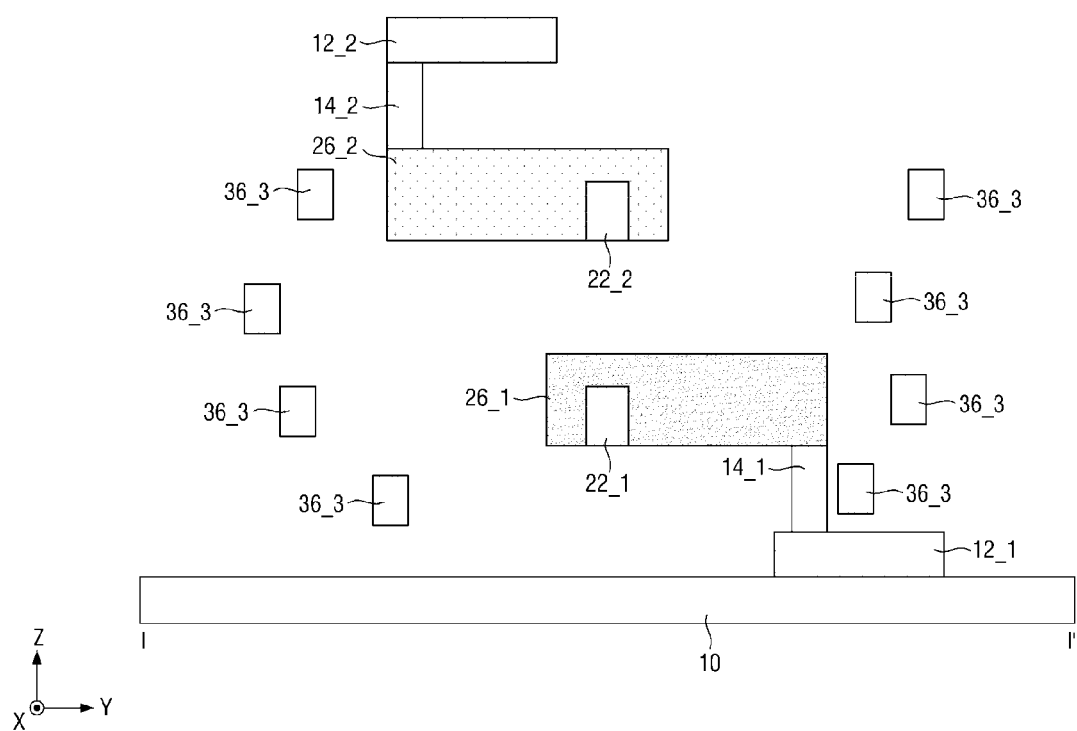
FIG. 31 a cross-sectional view taken along the line I-I' of FIG. 30, according to some embodiments of the present inventive concept.

FIG. 30 is a layout of an upper transistor region of the inverter of FIG. 21 according to some embodiments of the present inventive concept, and FIG. 31 a cross-sectional view taken along the line I-I' of FIG. 30. The inverter illustrated in FIGS. 30 and 31 may be similar to the inverter illustrated in FIGS. 28, 29A, and 29B except a location of a second power line 12_2.

Referring to FIG. 31, the second power line 12_2 may be on the upper source/drain region 26_2, and a second power via 14_2 may be provided between the second power line 12_2 and the upper source/drain region 26_2 to electrically connect the second power line 12_2 to the upper source/drain region 26_2. The routing wires 36_3 may be provided on both sides of the upper source/drain region 26_2 as illustrated in FIG. 31.

Figure 32A:
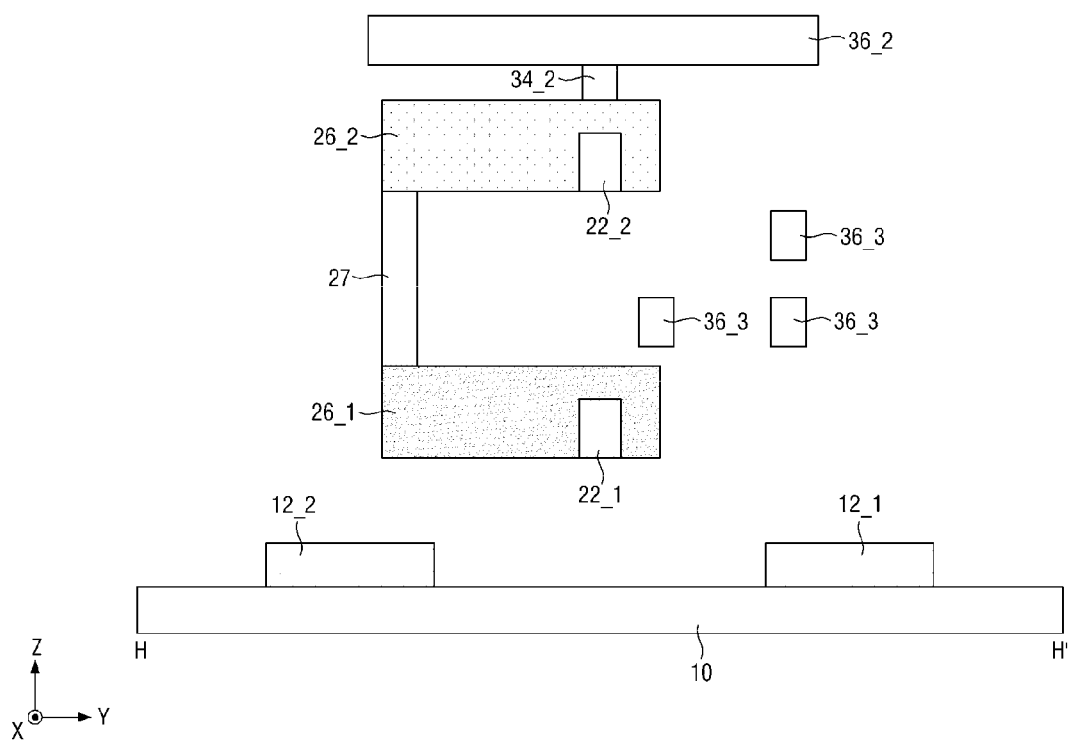
FIGS. 32A and 32B are cross-sectional views taken along the lines H-H' and I-I' of FIG. 26, respectively, according to some embodiments of the present inventive concept.
Figure 32B:
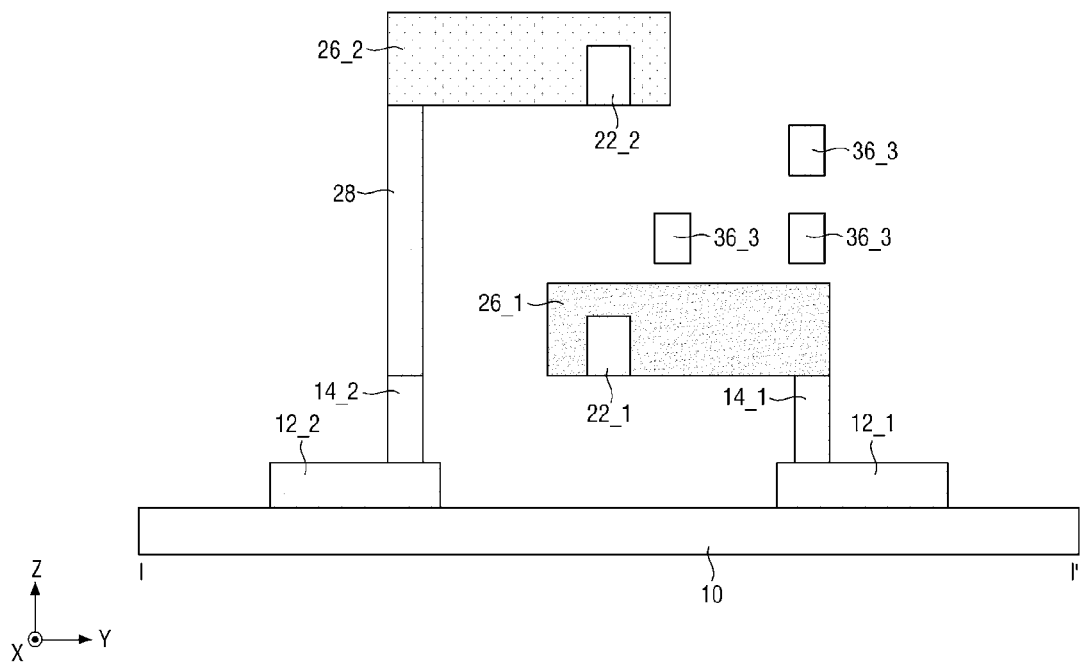

FIGS. 32A and 32B are cross-sectional views taken along the lines H-H' and I-I' of FIG. 26, respectively, according to some embodiments of the present inventive concept. Referring to FIGS. 32A and 32B, a lower source/drain region 26_1 and an upper source/drain region 26_2 may be spaced apart from each other in a third direction Z and one or more of routing wires 36_3 may be between the lower source/drain region 26_1 and the upper source/drain region 26_2. In some embodiments, the lower source/drain region 26_1 and the upper source/drain region 26_2 may be spaced apart from each other far enough such that multiple routing wires 36_3 spaced apart from each other in the third direction Z may be provided therebetween as illustrated in FIGS. 32A and 32B.

FIGS. 32A and 32B show two routing wires 36_3 that are spaced apart from each other in the third direction Z are provided between the lower source/drain region 26_1 and the upper source/drain region 26_2 but the present inventive concept is not limited thereto. For example, three or more routing wires 36_3 that are spaced apart from each other in the third direction Z may be provided between the lower source/drain region 26_1 and the upper source/drain region 26_2.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing. Like reference numbers refer to like elements throughout.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components, and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
   a first power line extending in a first direction on a substrate;
   a second power line extending in the first direction and being spaced apart from the first power line in a second direction intersecting the first direction;
   a lower active region extending in the first direction on the first and second power lines;
   a plurality of lower source/drain regions contacting the lower active region;
   an upper active region extending in the first direction on the lower active region;
   a plurality of upper source/drain regions contacting the upper active region;
   an input wire extending in the second direction on the upper active region;
   an output wire extending in the second direction and being spaced apart from the input wire in the first direction; and
   a routing wire connected to at least two of the plurality of the lower source/drain regions,
   wherein a lower surface of the input wire is placed at a higher level than an upper surface of the routing wire, and
   wherein a lower surface of the routing wire is placed at a higher level than an upper surface of the first power line.

2. The integrated circuit device of claim 1, wherein the routing wire overlaps the first power line or the second power line in a third direction intersecting the first direction and the second direction.

3. The integrated circuit device of claim 1, wherein the first power line is connected one of the plurality of lower source/drain regions by a first power via between the first power line and the one of the plurality of lower source/drain regions, and
wherein the second power line is connected one of the plurality of upper source/drain regions by a second power via between the second power line and the one of the plurality of upper source/drain regions.

4. The integrated circuit device of claim 1, wherein the upper surface of the routing wire contacts a lower surface of one of the plurality of lower source/drain regions.

5. The integrated circuit device of claim 1, wherein the routing wire is between lower surfaces of the plurality of lower source/drain regions and upper surfaces of the plurality of lower source/drain regions, and
wherein one of the plurality of lower source/drain regions and the routing wire are electrically connected to each other.

6. The integrated circuit device of claim 5, wherein a side surface of the routing wire contacts a side surface of the one of the plurality of lower source/drain regions.

7. The integrated circuit device of claim 5, wherein the upper surface of the routing wire and the upper surfaces of the plurality of lower source/drain regions are on a same plane.

8. The integrated circuit device of claim 7, wherein the lower surface of the routing wire and the lower surfaces of the plurality of lower source/drain regions are on the same plane.

9. The integrated circuit device of claim 1, wherein the lower surface of the routing wire contacts an upper surface of one of the plurality of lower source/drain regions.

10. The integrated circuit device of claim 1, wherein the routing wire is between upper surfaces of the plurality of upper source/drain regions and upper surfaces of the plurality of lower source/drain regions, and
wherein one of the plurality of lower source/drain regions and the routing wire are electrically connected to each other.

11. The integrated circuit device of claim 1, wherein the routing wire is between lower surfaces of the plurality of upper source/drain regions and upper surfaces of the plurality of lower source/drain regions, and
wherein one of the plurality of upper source/drain regions and the routing wire are electrically connected to each other.

12. The integrated circuit device of claim 1, wherein the routing wire is between lower surfaces of the plurality of upper source/drain regions and upper surfaces of the plurality of upper source/drain regions, and
wherein one of the plurality of upper source/drain regions and the routing wire are electrically connected to each other.

13. The integrated circuit device of claim 12, wherein the upper surface of the routing wire and the upper surfaces of the plurality of upper source/drain regions are on a same plane, and
wherein the lower surface of the routing wire and the lower surfaces of the plurality of upper source/drain regions are on the same plane.

14. An And-Or Invertor comprising:
a first power line extending in a first direction on a substrate;
a second power line extending in the first direction and being spaced apart from the first power line in a second direction intersecting the first direction;
a lower transistor region including a plurality of N-type transistors arranged along the first direction on the first and second power lines, the lower transistor region comprising:
a lower active region extending in the first direction;
a plurality of lower source/drain regions contacting the lower active region; and
a plurality of lower gate structures that contact the lower active region and are arranged alternately with the plurality of lower source/drain regions along the first direction;
an upper transistor region including a plurality of P-type transistors arranged along the first direction on the lower transistor region, the upper transistor region comprising:
an upper active region extending in the first direction;
a plurality of upper source/drain regions contacting the upper active region; and
a plurality of upper gate structures that contact the upper active region and are arranged alternately with the plurality of upper source/drain regions along the first direction, wherein the plurality of upper gate structures comprise a first upper gate structure;
an input wire extending in the second direction on the first upper gate structure;
an output wire extending in the second direction and being spaced apart from the input wire in the first direction; and
a routing wire connected to at least two of the plurality of the lower source/drain region,
wherein a lower surface of the input wire is placed at a higher level than an upper surface of the routing wire, and
wherein a lower surface of the routing wire is placed at a higher level than an upper surface of the first power line.

15. The And-Or Invertor of claim 14, wherein the plurality of N-type transistors and the plurality of P-type transistors are configured to receive inputs.

16. The And-Or Invertor of claim 14, wherein the routing wire is electrically connected to one of the plurality of lower source/drain regions or one of the plurality of upper source/drain regions.

17. The And-Or Invertor of claim 14, wherein each of the plurality of lower gate structures is electrically connected to a respective one of the plurality of upper gate structures.

18. An integrated circuit device comprising:
a pair of power lines extending in a first direction on a substrate and being spaced apart from each other in a second direction intersecting the first direction;
a lower active region extending in the first direction on the pair of power lines;
a plurality of lower source/drain regions contacting the lower active region;
an upper active region extending in the first direction on the lower active region;
a plurality of upper source/drain regions contacting the upper active region;
an input wire extending in the second direction on the upper active region;

an output wire extending in the second direction and being spaced apart from the input wire in the first direction; and
a metal line extending in the first direction and being under the input wire and the output wire and on the pair of power lines.

19. The integrated circuit device of claim 18, wherein the metal line is not connected to one of the plurality of lower source/drain regions and one of the plurality of upper source/drain regions.

20. The integrated circuit device of claim 18, wherein at least a portion of the metal line overlap one of the pair of power lines in a third direction intersecting the first direction and the second direction.

* * * * *